(12) United States Patent
Chung et al.

(10) Patent No.: US 10,163,992 B2
(45) Date of Patent: Dec. 25, 2018

(54) LARGE AREA MIRROR DISPLAY AND METHOD OF MANUFACTURING THE SAME

(71) Applicant: Samsung Display Co., Ltd, Yongin-si, Gyeonggi-do (KR)

(72) Inventors: Yun-Mo Chung, Yongin-si (KR); Byoungki Kim, Seoul (KR); Hojin Yoon, Hwaseong-si (KR); Dae Woo Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 192 days.

(21) Appl. No.: 15/236,940

(22) Filed: Aug. 15, 2016

(65) Prior Publication Data

US 2017/0192300 A1    Jul. 6, 2017

(30) Foreign Application Priority Data

Jan. 5, 2016    (KR) .................. 10-2016-0000918

(51) Int. Cl.
*G02F 1/1335* (2006.01)
*H01L 51/52* (2006.01)
*A47G 1/02* (2006.01)
*G02B 5/08* (2006.01)
*H01L 27/32* (2006.01)
*G02F 1/13* (2006.01)

(52) U.S. Cl.
CPC ............ *H01L 27/3246* (2013.01); *A47G 1/02* (2013.01); *H01L 27/3248* (2013.01); *H01L 27/3258* (2013.01); *H01L 51/5271* (2013.01); *G02B 5/08* (2013.01); *G02F 1/1313* (2013.01); *G02F 1/133553* (2013.01); *G02F 1/133555* (2013.01)

(58) Field of Classification Search
CPC ......... G02F 1/133553; G02F 1/133555; H01L 51/5271; A47G 1/02; A47G 1/00; G02B 5/08; G02B 5/0816; G02B 5/0875
See application file for complete search history.

(56) References Cited

U.S. PATENT DOCUMENTS

| | | | |
|---|---|---|---|
| 8,933,625 B2 | 1/2015 | Chung et al. | |
| 2012/0299472 A1* | 11/2012 | Chung ............... | H01L 51/5271 313/504 |
| 2014/0160411 A1* | 6/2014 | Yim .................. | G02F 1/133553 349/113 |

* cited by examiner

*Primary Examiner* — Jia Pan
(74) *Attorney, Agent, or Firm* — Innovation Counsel LLP

(57) ABSTRACT

A mirror display device includes a mirror module and a display module. The mirror module includes a transparent substrate and a plurality of first mirror patterns. The transparent substrate has a first region and a second region adjacent to the first region. The first mirror patterns are disposed on a surface of the transparent substrate in the first region. The display module includes a display part that emits a light and a plurality of second mirror patterns. The display module is combined with the mirror module on the surface of the transparent substrate in the second region.

20 Claims, 31 Drawing Sheets

LARGE AREA MIRROR DISPLAY AND METHOD OF MANUFACTURING THE SAME

CROSS-REFERENCE TO RELATED APPLICATION

This application claims priority under 35 USC § 119 to Korean Patent Application No. 10-2016-0000918 filed on Jan. 5, 2016 in the Korean Intellectual Property Office (KIPO), the entire disclosure of which is incorporated by reference herein in its entirety.

BACKGROUND

1. Field

The present disclosure relates to a mirror display device, more particularly, to a mirror display device including a plurality of mirror patterns and a method of manufacturing the mirror display device.

2. Description of the Related Art

Recently, a display device such as an organic light emitting display (OLED) device and a liquid crystal display (LCD) device having a mirror property together with an image display property has been developed and introduced to the market. In particular, demands for a large-sized display device having a mirror property together with an image display property have been increasing.

A conventional large-sized mirror display device includes a half mirror with a display panel combined with a rear surface of the half mirror. Since the half mirror has both a reflective property and a transmitting property, the mirror display device including the half mirror has a low reflectivity, for example, less than 60%. Furthermore, an image is separated by a gap between the display panel and the half mirror thereby reducing visibility and deteriorating color impression depending on a view angle.

SUMMARY

Example embodiments provide a mirror display device having an improved display quality and a method of manufacturing the mirror display device.

According to an exemplary embodiment, a mirror display device includes a mirror module and a display module. The mirror module includes a transparent substrate and a plurality of first mirror patterns. The transparent substrate includes a first region and a second region adjacent to the first region. The first mirror patterns are disposed on a surface of the transparent substrate in the first region. The display module includes a display part that emits a light and a plurality of second mirror patterns. The display module is combined with the mirror module on the surface of the transparent substrate in the second region.

In an exemplary embodiment, the mirror module includes a first mirror layer continuously extending along the first mirror patterns. The display module further includes a second mirror layer continuously extending along the second mirror patterns.

In an exemplary embodiment, the display part includes a light-emitting area and a non-emitting area. The light-emitting area overlaps an area between the second mirror patterns. The non-emitting area overlaps a stacked area where the second mirror layer overlaps the second mirror patterns.

In an exemplary embodiment, the light-emitting area includes an organic light-emitting layer or a liquid crystal layer.

In an exemplary embodiment, a distance between the first mirror patterns and the surface of the transparent substrate is substantially same as a distance between the second mirror patterns and the surface of the transparent substrate.

In an exemplary embodiment, the display module further includes a base substrate on which the second mirror patterns are disposed. The base substrate is disposed between the second mirror patterns and the transparent substrate.

In an exemplary embodiment, the display module further includes a base substrate on which the second mirror patterns are disposed. The second mirror patterns are disposed between the base substrate and the transparent substrate.

In an exemplary embodiment, the first and second mirror patterns and the first and second mirror layers include a metal.

In an exemplary embodiment, the first and second mirror patterns include a first material. The first and second mirror layers include a second material that is different from the first material.

In an exemplary embodiment, the mirror module further includes a phase compensation layer disposed between the first mirror patterns and the transparent substrate in the first region.

In an exemplary embodiment, the mirror module further includes a recess, in which at least a portion of the display module is disposed, in the second region of the transparent substrate.

According to an exemplary embodiment, a mirror display device includes a mirror module and a display module. The mirror module includes a transparent substrate and a plurality of first mirror patterns disposed on a surface of the transparent substrate in a first region of the transparent substrate. The display module is combined with the transparent substrate in a second region of the transparent substrate that is adjacent to the first region of the transparent substrate and includes a display part that emits a light.

In an exemplary embodiment, wherein the display part includes a plurality of switching elements disposed on a substrate, an insulation structure that covers the switching elements, a first electrode that passes through the insulation structure and is electrically connected to the switching elements, a display layer disposed on the first electrode, and a second electrode disposed on the display layer. The display module further includes a thin film encapsulation layer disposed on a surface of the second electrode.

In an exemplary embodiment, the display module further includes a pixel-defining layer disposed on the insulation structure. The pixel-defining layer includes an opening that exposes the first electrode.

In an exemplary embodiment, the thin film encapsulation layer is combined with the transparent substrate in the second region. A thickness of the thin film encapsulation layer is less than a distance between a first opening and a second opening that is adjacent to the first opening, of the pixel-defining layer.

In an exemplary embodiment, the substrate is combined with the transparent substrate in the second region. A thickness of the substrate is less than a distance between a first opening and a second opening that is adjacent to the first opening, of the pixel-defining layer.

According to an exemplary embodiment, a method of manufacturing a mirror display device is provided. The method includes providing a display module and a mirror module. The display module is combined with the mirror module. The display module includes a substrate, a mirror substrate, and a display part disposed between the substrate and the mirror substrate. The mirror module includes a transparent substrate, a plurality of first mirror patterns and a first mirror layer continuously extending along the first mirror patterns. The transparent substrate includes a first region and a second region adjacent to the first region. The first mirror patterns are disposed on a surface of the transparent substrate in the first region. The display module is combined with the mirror module such that the display module overlaps the transparent substrate in the first region.

In an exemplary embodiment, the providing the display module further includes forming a plurality of second mirror patterns on a base substrate, and forming a second mirror layer continuously extending along the second mirror patterns.

In an exemplary embodiment, the mirror module further includes a phase compensation layer disposed between the first mirror patterns and the transparent substrate in the second region.

In an exemplary embodiment, the mirror module further includes a recess, in which at least a portion of the display module is disposed, in the second region of the transparent substrate.

According to exemplary embodiments, the mirror module may include the first mirror patterns and the first mirror layer, and the display module may include the second mirror patterns and the second mirror layer. The mirror module may have a substantially similar or same mirror structure as the display module. Therefore, problems such as image blurring, image separation or the like may be reduced and/or prevented.

According to exemplary embodiments, the mirror module may include a phase compensation layer or a recess for receiving the display module.

According to exemplary embodiments, the mirror display device may include the mirror module and the display module combined with the mirror module. Thus, a large-sized mirror display device may be effectively achieved. Furthermore, deterioration of display quality may be reduced and/or prevented.

BRIEF DESCRIPTION OF THE DRAWINGS

Example embodiments will be more clearly understood from the following detailed description taken in conjunction with the accompanying drawings.

FIG. 1 is a cross-sectional view illustrating a mirror display device, according to an exemplary embodiment.

FIG. 2 is an enlarged cross-sectional view illustrating the region 'A' of FIG. 1.

FIG. 3 is an enlarged cross-sectional view illustrating the region 'B' of FIG. 1.

FIGS. 4, 5, 6, 7, 8, 9, 10, 11, 12, and 13 are cross-sectional views illustrating a method of manufacturing a mirror display device, according to an exemplary embodiment.

FIG. 14 is a plan view illustrating a mirror display device, according to an exemplary embodiment.

FIG. 15 is a cross-sectional view illustrating a mirror display device, according to an exemplary embodiment.

FIGS. 16, 17, 18, 19, 20, and 21 are cross-sectional views illustrating a method of manufacturing a mirror display device, according to an exemplary embodiment.

FIG. 22 is a cross-sectional view illustrating a mirror display device, according to an exemplary embodiment.

FIGS. 23, 24, 25, 26, 27, and 28 are cross-sectional views illustrating a method of manufacturing a mirror display device, according to an exemplary embodiment.

FIG. 29 is a cross-sectional view illustrating a mirror display device, according to an exemplary embodiment.

FIG. 30 is a cross-sectional view illustrating a mirror display device, according to an exemplary embodiment.

FIG. 31 is an enlarged cross-sectional view illustrating the region 'C' of FIG. 30.

FIG. 32 is a cross-sectional view illustrating a mirror display device, according to an exemplary embodiment.

FIG. 33 is an enlarged cross-sectional view illustrating the region 'D' of FIG. 32.

DETAILED DESCRIPTION OF THE EMBODIMENTS

Figure 1:
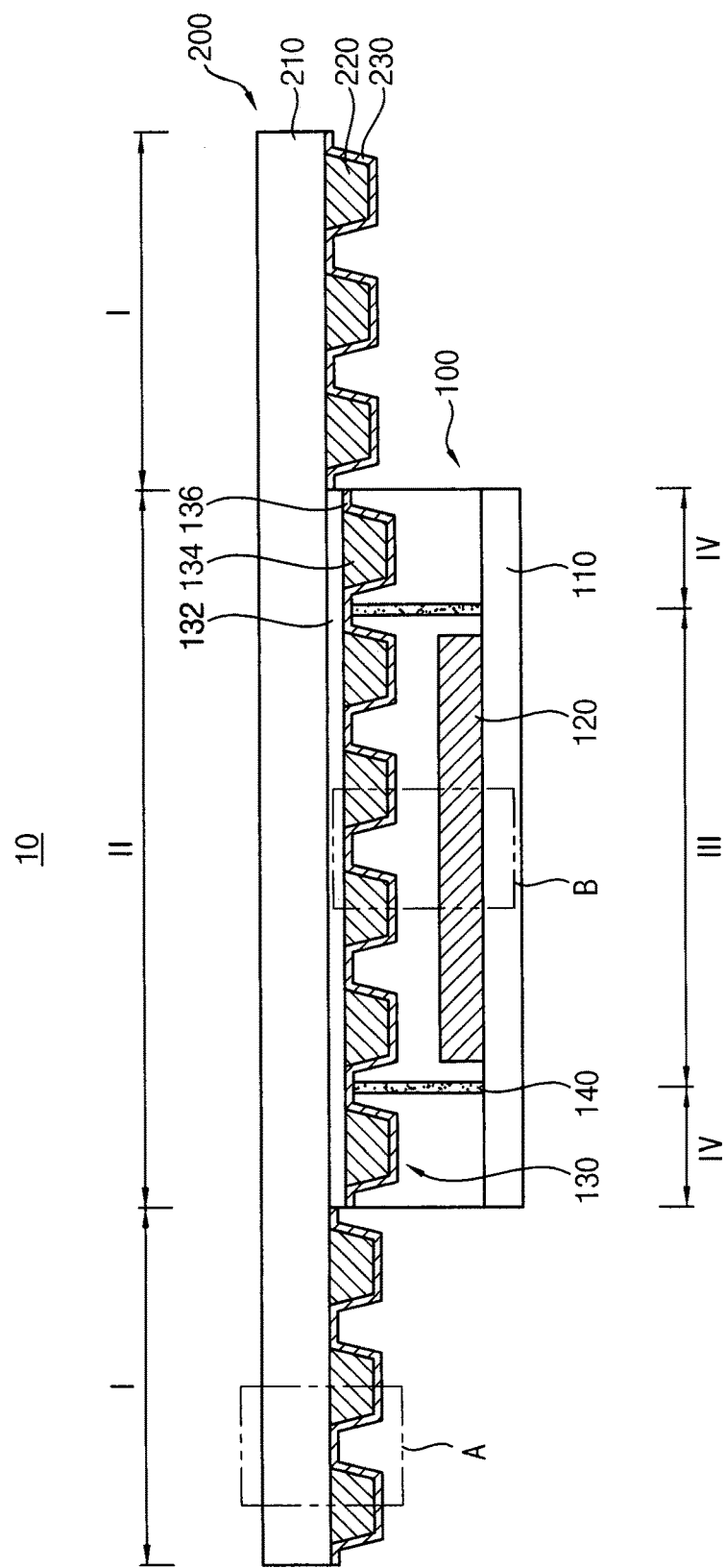
FIGS. 1 to 33 represent non-limiting, example embodiments as described herein.

Various example embodiments will be described hereinafter with reference to the accompanying drawings, in which some example embodiments are shown. Same reference numerals may be used for same elements in the drawings, and any repeated explanation may be omitted.

Figure 2:
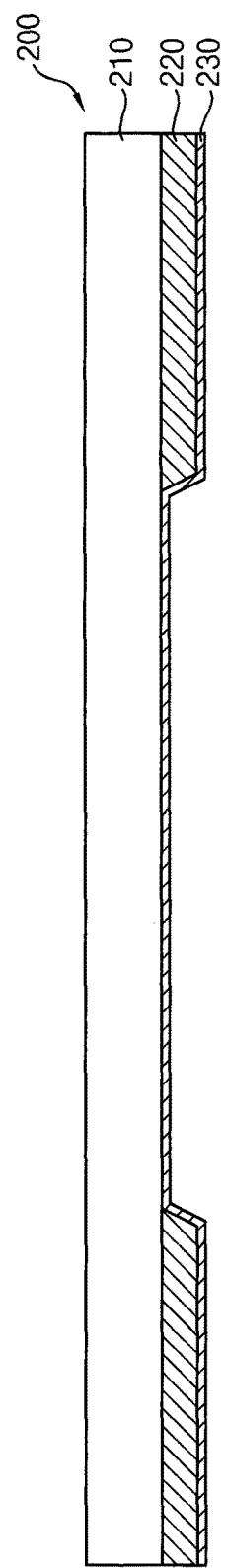
Figure 3:
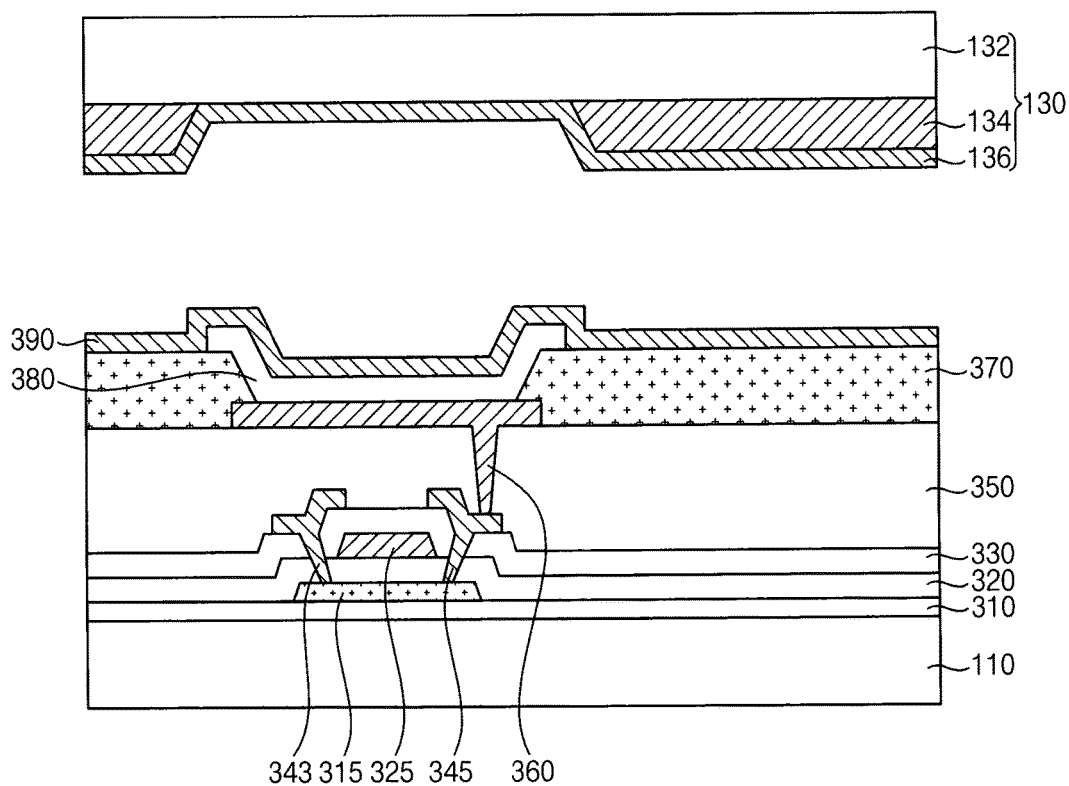

FIG. 1 is a cross-sectional view illustrating a mirror display device, according to an exemplary embodiment. FIG. 2 is an enlarged cross-sectional view illustrating the region 'A' of FIG. 1. FIG. 3 is an enlarged cross-sectional view illustrating the region 'B' of FIG. 1.

Referring to FIGS. 1 to 3, a mirror display device 10 includes a display module 100 and a mirror module 200. The display module 100 includes a substrate 110, a display part 120 disposed on the substrate 110, and a mirror substrate 130 opposing the substrate 110 so that the display part 120 is interposed between the substrate 110 and the mirror substrate 130.

The mirror module 200 includes a transparent substrate 210 including a second region II, a plurality of first mirror patterns 220 disposed in a first region I of the transparent substrate 210 that is adjacent to the second region II, and a first mirror layer 230 continuously extending along the first mirror patterns 220. The transparent substrate 210 may be divided into the first region I and the second region II. The second region II of the transparent substrate 210 may overlap the display module 100, and may function as a display and a mirror. The first region I of the transparent substrate 210 may be adjacent to the second region II, and may function as a mirror.

In some embodiments, the transparent substrate 210 may include a glass substrate, a transparent plastic substrate, or the like. The transparent substrate 210 may support the first mirror patterns 220, the first mirror layer 230, and the display module 100.

The first mirror patterns 220 may be disposed in the first region I of the transparent substrate 210. For example, the first mirror patterns 220 may have a grid shape, a linear shape, a mesh shape, or an island shape, and may have a substantially uniform spacing therebetween.

The first mirror patterns 220 may include a reflective material. For example, the first mirror patterns 220 may include a metal such as aluminum (Al), chromium (Cr), copper (Cu), silver (Ag), titanium (Ti), tantalum (Ta), molybdenum (Mo), tungsten (W), or the like.

The first mirror layer 230 may be disposed on a substantially entire portion of the first region I of the transparent substrate 210 to cover the first mirror patterns 220. In an exemplary embodiment, the first mirror layer 230 may continuously extend in the first region I of the transparent substrate 210. The first mirror layer 230 may contact a lower surface of the transparent substrate 210 and the first mirror patterns 220. In an exemplary embodiment, a reflectivity of the first mirror layer 230 may be less than a reflectivity of the first mirror patterns 220.

The display part 120 may include a switching element (not shown) disposed on the substrate 110 and a display element electrically connected to the switching element. Referring to FIG. 3, the switching element may include a thin film transistor including an active pattern 315, a gate insulation layer 320, a gate electrode 325, a source electrode 343, and a drain electrode 345. The display element may include a first electrode 360, a display layer 380, and a second electrode 390. In some embodiments, the substrate 110 may include a glass substrate, a transparent plastic substrate, a flexible plastic substrate, or the like.

A barrier layer 310 may be disposed on an upper surface of the substrate 110. The barrier layer 310 may prevent vapors from entering into the display part 120, and may prevent impurities from diffusing between the substrate 110 and the display part 120. In some embodiments, the barrier layer 310 may include silicon oxide, silicon nitride, or silicon oxynitride. These materials may be used each alone or in a combination thereof. The barrier layer 310 may have a stacked structure including a silicon oxide layer and a silicon nitride layer.

In an exemplary embodiment, the active pattern 315 may include silicon compound such as polysilicon. In another exemplary embodiment, the active pattern 315 may include a semiconductive oxide such as indium gallium zinc oxide (IGZO), zinc tin oxide (ZTO), indium tin zinc oxide (ITZO), or the like. For example, the active pattern 315 may be formed by disposing an active layer including silicon or a semiconductive oxide through a sputtering process, and patterning the active layer through a photolithography process.

The gate insulation layer 320 may be disposed on the barrier layer 310 to cover the active pattern 315. For example, the gate insulation layer 320 may include silicon oxide, silicon nitride, or silicon oxynitride. In an exemplary embodiment, the gate insulation layer 320 may have a stacked structure including a silicon oxide layer and a silicon nitride layer.

The gate electrode 325 may be disposed on the gate insulation layer 320 and may overlap the active pattern 315. For example, a first conductive layer may be disposed on the gate insulation layer 320, and then patterned through a photolithography process to form the gate electrode 325. The first conductive layer may include a metal such as Al, Ag, W, Cu, Mo, Ti, Ta, Cr or the like, a metal alloy thereof, or a metal nitride thereof. The first conductive layer may be formed through a sputtering process, an atomic layer deposition (ALD) process, or the like. The first conductive layer may have a stacked structure including a plurality of layers. For example, the first conductive layer may have a stacked structure of an Al layer and a Mo layer, or a stacked structure of a Ti layer and a Cu layer.

In an exemplary embodiment, a scan line may be formed from the first conductive layer. The gate electrode 325 may branch from the scan line.

In an exemplary embodiment, a source region and a drain region are formed at ends of the active pattern 315 through an impurity-implanting process using the gate electrode 325 as a mask. A portion of the active pattern 315 that overlaps the gate electrode 325 and is disposed between the source region and the drain region may define a channel region through which electrons are transmitted.

An insulation interlayer 330 may be disposed on the gate insulation layer 320 to cover the gate electrode 325. The insulation interlayer 330 may include silicon oxide, silicon nitride, or silicon oxynitride. In an exemplary embodiment, the insulation interlayer 330 may have a stacked structure including a silicon oxide layer and a silicon nitride layer.

The source electrode 343 and the drain electrode 345 may pass through the insulation interlayer 330 and the gate insulation layer 320 to contact the active pattern 315. For example, the source electrode 343 and the drain electrode 345 may contact the source region and the drain region of the active pattern 315, respectively.

For example, the insulation interlayer 330 and the gate insulation layer 320 may be partially etched to form contact holes exposing portions of the active pattern 315. A second conductive layer filling the contact holes may be disposed on the insulation interlayer 330 and may be patterned to form the source electrode 343 and the drain electrode 345. The second conductive layer may include a substantially same material as the first conductive layer.

According to the above, a thin film transistor may be disposed in each pixel of the display part 120. In an exemplary embodiment, at least two thin film transistors and a capacitor may be disposed in each pixel. The thin film transistor including the source electrode 343, the drain electrode 345, and the gate electrode 325 may have a top-gate structure including the gate electrode 325 disposed on the active pattern 315, however the present disclosure is not limited thereto. For example, a thin film transistor may have a bottom-gate structure including a gate electrode disposed under an active pattern in another exemplary embodiment.

In an exemplary embodiment, a data line may be formed from the second conductive layer. For example, the source electrode 343 may branch from the data line.

A via insulation layer 350 may be disposed on the insulation interlayer 330 to cover the source electrode 343 and the drain electrode 345. For example, the via insulation layer 350 may include an organic material such as polyimide, epoxy resin, acryl resin, polyester, or the like. The via insulation layer 350 may be formed through a spin-coating process, a slit-coating process, or the like. The via insulation layer 350 may function to flatten a surface of the display part 120.

The display element including the first electrode 360, the display layer 380, and the second electrode 390 may be disposed on the via insulation layer 350. For example, the first electrode 360 may pass through the via insulation layer 350 to contact the drain electrode 345. For example, the via insulation layer 350 may be partially etched to form a via hole exposing an upper surface of the drain electrode 345. A third conductive layer filling the via hole may be disposed on the via insulation layer 350 and patterned to form the first electrode 360.

The first electrode 360 may function as an anode or a pixel electrode of the display part 120. The first electrode 360 may be disposed in each pixel of the display part 120.

The third conductive layer may include at least one of a metal, a metal alloy, a metal nitride, and a transparent conductive material such as a metal oxide. For example, the third conductive layer may include a substantially same material as the first conductive layer. The third conductive layer may include a transparent conductive material as indium tin oxide, indium zinc oxide, zinc oxide, indium oxide, or the like. For example, the third conductive layer may have a stacked structure of an ITO layer, an Ag layer and an ITO layer.

A pixel-defining layer 370 may be disposed on the via insulation layer 350. The pixel-defining layer 370 may cover an end portion of the first electrode 360. For example, the pixel-defining layer 370 may be formed from a photosensitive organic material through a light-exposure process and a developing process. In another exemplary embodiment, the pixel-defining layer 370 may include an inorganic material such as a silicon compound through a photolithography process.

In an exemplary embodiment, an area of the first electrode 360 that is exposed through the pixel-defining layer 370 may define a light-emitting area of each pixel. The display layer 380 may be disposed on the first electrode 360. The display layer 380 may extend on the pixel-defining layer 370. In an exemplary embodiment, the display part 380 may include an organic light-emitting material so that the display device may be used for an organic light-emitting display (OLED). In an exemplary embodiment, a hole transport layer (HTL) and an electron transport layer (ETL) may be provided on and under the display layer 380. Furthermore, a hole injection layer (HIL) may be provided between the hole transport layer and the first electrode 360. An electron injection layer (EIL) may be provided between the electron transport layer and the second electrode 390.

For example, an organic light-emitting material may be selectively printed in each pixel to form the display layer 380. At least one of the HTL, ETL, HIL, and EIL may be selectively disposed in each pixel, or may be disposed entirely on the substrate 110. The display device may have an RGB configuration in which each pixel selectively emits a light having one of a red, a green and a blue in an exemplary embodiment, however the present disclosure is not limited thereto. For example, the display device may have a white OLED (WOLED) configuration including a white pixel emitting a white light.

In another exemplary embodiment, a liquid crystal material may be provided for the display layer 380. The display device including the liquid crystal material may be used as a liquid crystal display (LCD).

The second electrode 390 may be disposed on the display layer 380. The second electrode 390 may extend on the pixel-defining layer 370. The second electrode 390 may be commonly provided for a plurality of pixels. The second electrode 390 may function as a cathode of the display part 120. For example, the second electrode 390 may be formed by depositing a metal or a transparent conductive material using an open mask.

The mirror substrate 130 may include a base substrate 132, a plurality of second mirror patterns 134, and a second mirror layer 136. The second mirror patterns 134 may be disposed under the base substrate 132, and may correspond to the first mirror patterns 220. The second mirror layer 136 may extend along the second mirror patterns 134, and may correspond to the first mirror layer 230.

In exemplary embodiment, the base substrate 132 may be divided into a third region III and a fourth region IV by a sealing part 140. The sealing part 140 may have a ring shape or a pillar shape that surrounds the third region III. An area disposed outside the sealing part 140 may define the fourth region IV.

The third region III may overlap a pixel area of the display module 100. The third region III may further overlap a portion of a peripheral area, for example, when the mirror substrate 130 is provided as an encapsulation substrate for the display module 100. The fourth region IV may overlap a wiring area in which a wiring providing a power to the display module 100 is provided.

For example, the base substrate 132 may include a glass substrate, a transparent plastic substrate, or the like. For example, the sealing part 140 may include an adhesive material such as a silicone resin, an epoxy resin, or the like. The sealing part 140 may include various materials capable of blocking external impurities or vapors.

The second mirror patterns 134 may be disposed in the third region III and the fourth region IV of the base substrate 132. For example, the second mirror patterns 134 may have a grid shape, a linear shape, a mesh shape, or an island shape, and may have a substantially uniform spacing therebetween.

The second mirror patterns 134 may include a reflective material. For example, the second mirror patterns 134 may include a metal such as aluminum (Al), chromium (Cr), copper (Cu), silver (Ag), titanium (Ti), tantalum (Ta), molybdenum (Mo), tungsten (W), or the like.

When the mirror substrate 130 is provided as an encapsulation substrate for the display module 100, at least a portion of the second mirror patterns 134 in the third region III may overlap a non-emitting area of the display module 100. The non-emitting area of the display module 100 may be defined by an area excluding a light-emitting area, for example, an area between adjacent first electrodes 360. An area between adjacent second mirror patterns 134 in the third region III may overlap the light-emitting area of the display module 100. In an exemplary embodiment, the area between adjacent second mirror patterns 134 may overlap at least a portion of the light-emitting area of the display module 100.

The second mirror patterns 134 in the fourth region IV may not overlap the pixel area of the display module 100. At least a portion of the second mirror patterns 134 in the third region III may not overlap the pixel area of the display module 100. The second mirror patterns 134 in the third region III and the fourth region IV may be arranged to be spaced apart from each other by a uniform spacing.

The second mirror layer 136 may be disposed under the base substrate 132 to cover the second mirror patterns 134. In an exemplary embodiment, the second mirror layer 136 may extend to be continuously disposed in the third region III and the fourth region IV of the base substrate 132.

The second mirror layer 136 may contact a lower surface of the base substrate 132 and the second mirror patterns 134. In an exemplary embodiment, the second mirror layer 136 may have a reflectivity less than the second mirror patterns 134. A portion of the second mirror layer 136 that is disposed between adjacent second mirror patterns 134, may overlap the light-emitting area of the display module 100.

The sealing part 140 may be disposed on a boundary between the third region III and the fourth region IV. The sealing part 140 may be disposed under the second mirror layer 136.

In an exemplary embodiment, the display module 100 may be combined with the mirror module 200, and the base substrate 132 may be spaced apart from the transparent substrate 210 of the mirror module 200.

The first mirror patterns 220 and the second mirror patterns 134 may include a substantially same material. The first mirror layer 230 and the second mirror layer 136 may include a substantially same material.

In an exemplary embodiment, the mirror module 200 may include the first mirror patterns 220 and the first mirror layer 230, and the display module 100 may include the second mirror patterns 134 and the second mirror layer 136. Thus, the mirror module 200 may have a similar or same mirror structure as the display module 100. Therefore, problems such as image blurring, image separation, or the like may be reduced and/or prevented.

According to an exemplary embodiment, the mirror display device 10 may include the mirror module 200 and the display module 100 combined with the mirror module 200. Thus, a large-sized mirror display device may be effectively achieved. Furthermore, deterioration of display quality may be reduced and/or prevented.

Hereinafter, a method of manufacturing a mirror display device will be described in further detail. FIGS. 4 to 13 are cross-sectional views illustrating a method of manufacturing a mirror display device, according to an exemplary embodiment. For example, FIGS. 4 to 6 may be cross-sectional views illustrating a method of manufacturing the mirror display device 10 illustrated in FIG. 1.

Figure 4:
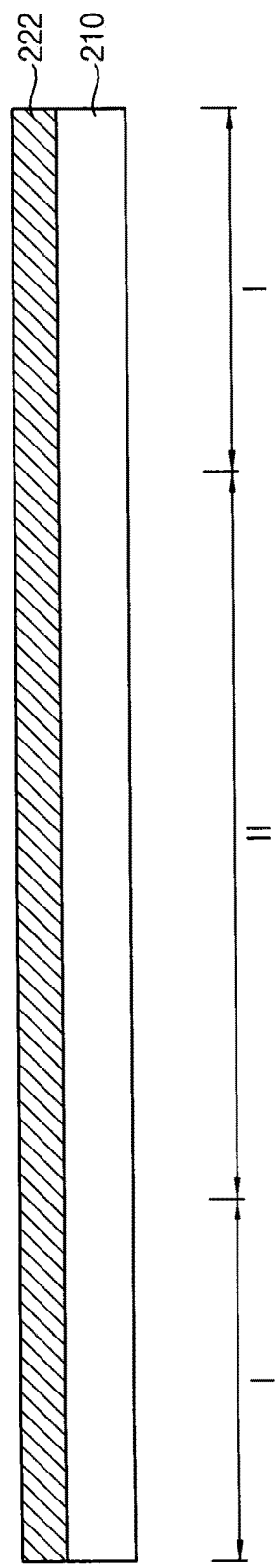

Referring to FIG. 4, a metal layer 222 may be disposed on a transparent substrate 210. The transparent substrate 210 may include a glass substrate, a transparent plastic substrate, or the like. The transparent substrate 210 may be divided into a first region I and a second region II. The first region I and the second region II may be defined respectively by a peripheral portion and a central portion of the transparent substrate 210.

The metal layer 222 may include a metal such as Al, Ag, W, Cu, Mo, Ti, Ta, Cr, or the like. These metals may be used each alone or in a combination thereof. The metal layer 222 may be formed through a sputtering process, a physical vapor deposition (PVD) process, an ALD process, a chemical vapor deposition (CVD) process, a plasma enhanced chemical vapor deposition (PECVD) process, a heat deposition process, a vacuum deposition process, or the like.

Figure 5:
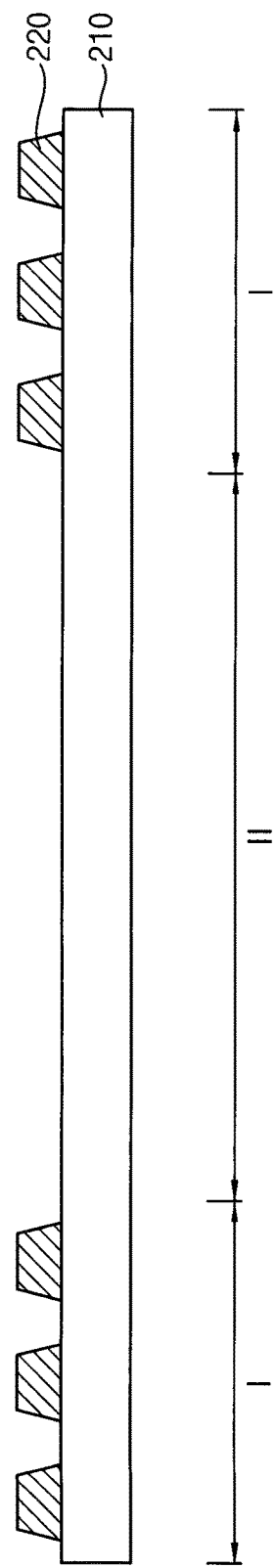

Referring to FIG. 5, the metal layer 222 may be patterned, for example, through a photolithography process, to form a plurality of first mirror patterns 220. For example, the first mirror patterns 220 may be disposed in the first region I of the transparent substrate 210. The first mirror patterns 220 may have a grid shape, a linear shape, a mesh shape or an island shape, and may have a substantially uniform spacing therebetween.

Figure 6:
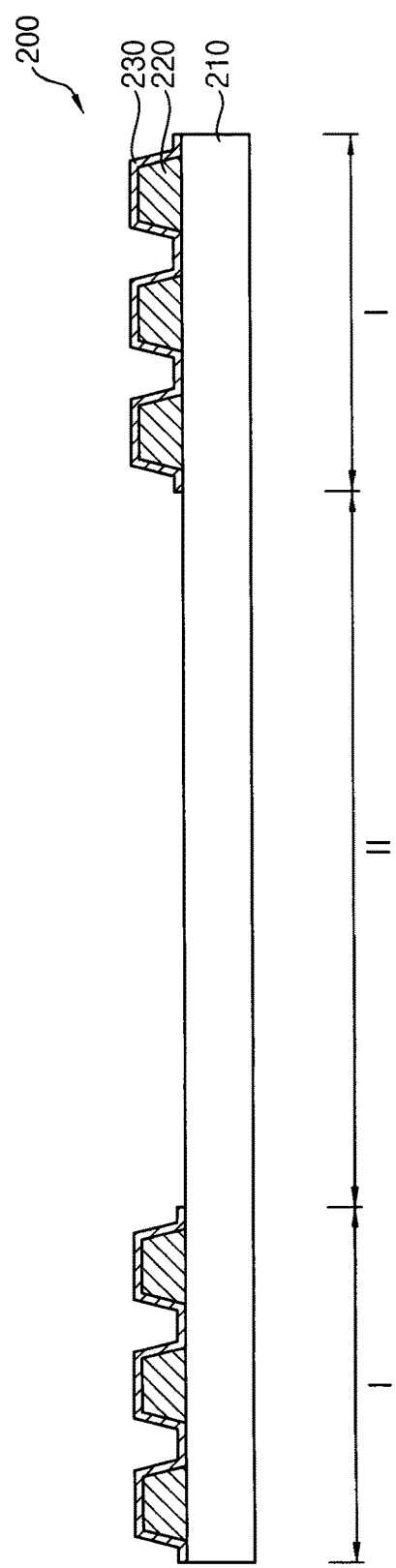

Referring to FIG. 6, a first mirror layer 230 is disposed on an upper surface of the transparent substrate 210 in the first region I and on the first mirror patterns 220 to form a mirror module 200. A thickness of the first mirror layer 230 may be less than a thickness of the first mirror patterns 220 such that the first mirror layer 230 may transmit a light incident thereon. Thus, a light entering into the first mirror layer 230 may pass through the mirror module 200 in an area where the first mirror patterns 220 are not disposed so that an image may be displayed through the mirror module 200. In an exemplary embodiment, the first mirror layer 230 covers the first mirror patterns 210, and may be conformally disposed in the first region I of the transparent substrate 210. Thus, image deterioration due to diffraction of a light passing between the first mirror patterns 220. The first mirror layer 230 may be formed through a sputtering process, a PVD process, an ALD process, a CVD process, a PECVD process, a heat deposition process, a vacuum deposition process, or the like.

Figure 7:
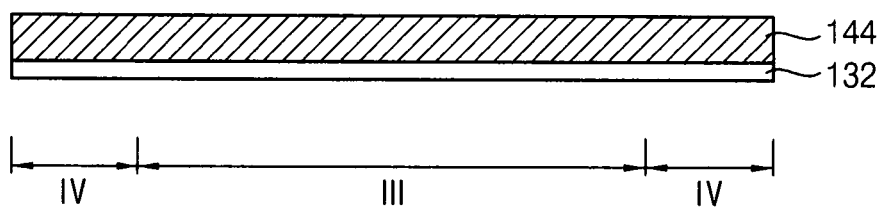

Referring to FIG. 7, a metal layer 144 may be disposed on a base substrate 132. The base substrate 132 may be a transparent substrate. The base substrate 132 may include a glass substrate, a transparent plastic substrate, or the like. The base substrate 132 may be divided into a third region III and a fourth region IV. The third region III and the fourth region IV may be defined respectively by a central portion and a peripheral portion of the base substrate 132. The metal layer 144 may include a metal such as Al, Ag, W, Cu, Mo, Ti, Ta, Cr, or the like. These metals may be used each alone or in a combination thereof. The metal layer 144 may be formed through a sputtering process, a PVD process, an ALD process, a CVD process, a PECVD process, a heat deposition process, a vacuum deposition process, or the like.

Figure 8:
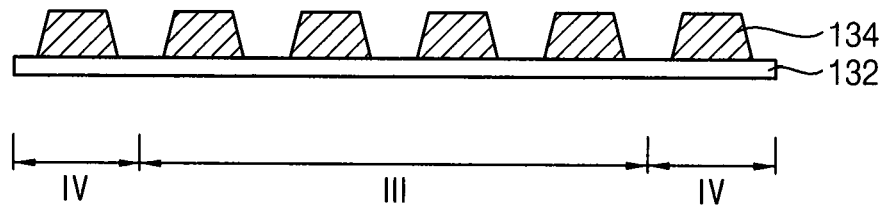

Referring to FIG. 8, the metal layer 144 may be patterned, for example, through a photolithography process, to form a plurality of second mirror patterns 134. The second mirror patterns 134 may be disposed in the third region III and the fourth region IV of the base substrate 132. The second mirror patterns 134 may have a grid shape, a linear shape, a mesh shape or an island shape, and may have a substantially uniform spacing therebetween.

Figure 9:
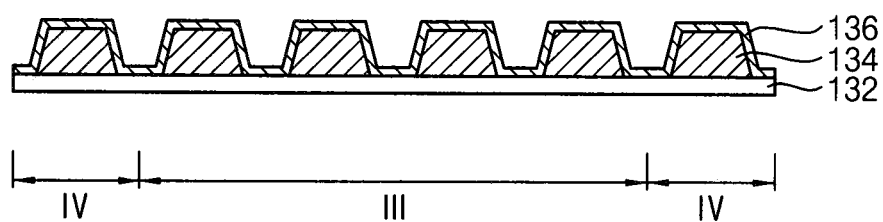

Referring to FIG. 9, a second mirror layer 136 is disposed on an upper surface of the base substrate 132 and on the second mirror patterns 134. A thickness of the second mirror layer 136 may be less than a thickness of the second mirror patterns 134. The second mirror layer 136 covers the second mirror patterns 134, and may be conformally disposed in the third region III and the fourth region IV of the base substrate 132. The second mirror layer 136 may be formed through a sputtering process, a PVD process, an ALD process, a CVD process, a PECVD process, a heat deposition process, a vacuum deposition process, or the like.

Figure 10:
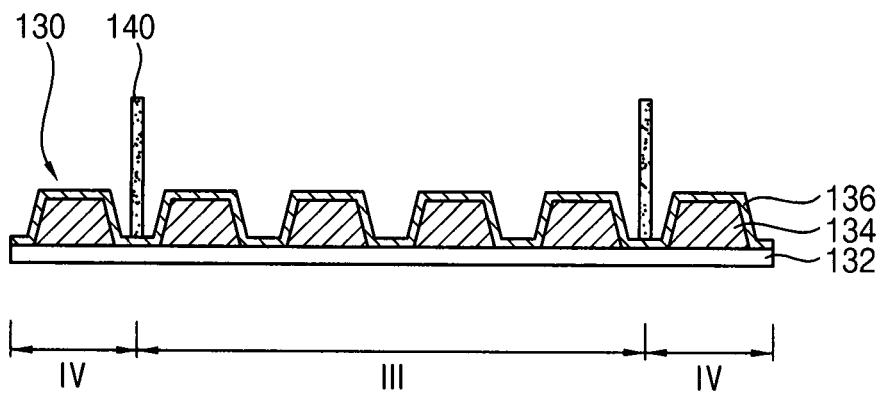

Referring to FIG. 10, a sealing part 140 is disposed between the third region III and the fourth region IV of the base substrate 132. An adhesive resin such as an epoxy resin, a silicone resin, or the like may be provided on the base substrate 132 through a printing process, a coating process, or the like to form the sealing part 140.

Figure 11:
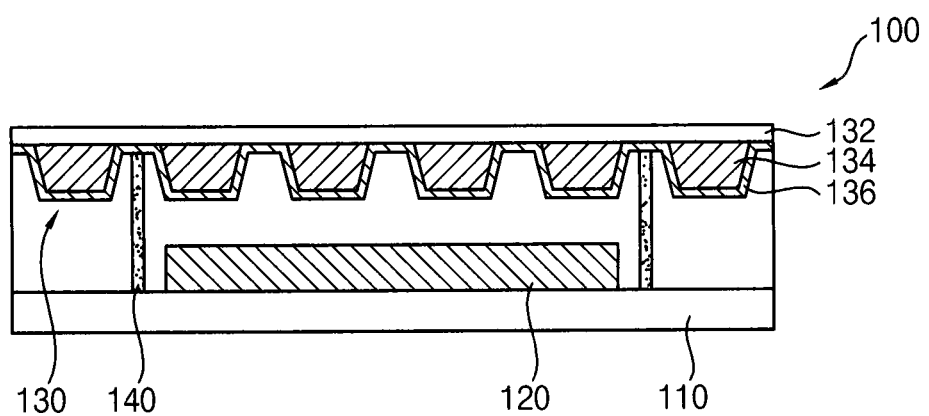

Referring to FIG. 11, the mirror substrate 130 may be combined with a substrate 110 including a display part 120 through an encapsulation process to manufacture a display module 100. The sealing part 140 is disposed between the mirror substrate 130 and the substrate 110. For example, the substrate 110 and the mirror substrate 130 may be combined with each other by using the second mirror pattern 132 in the fourth region IV of the base substrate 132 as an align key to manufacture the display module 100.

Figure 12:
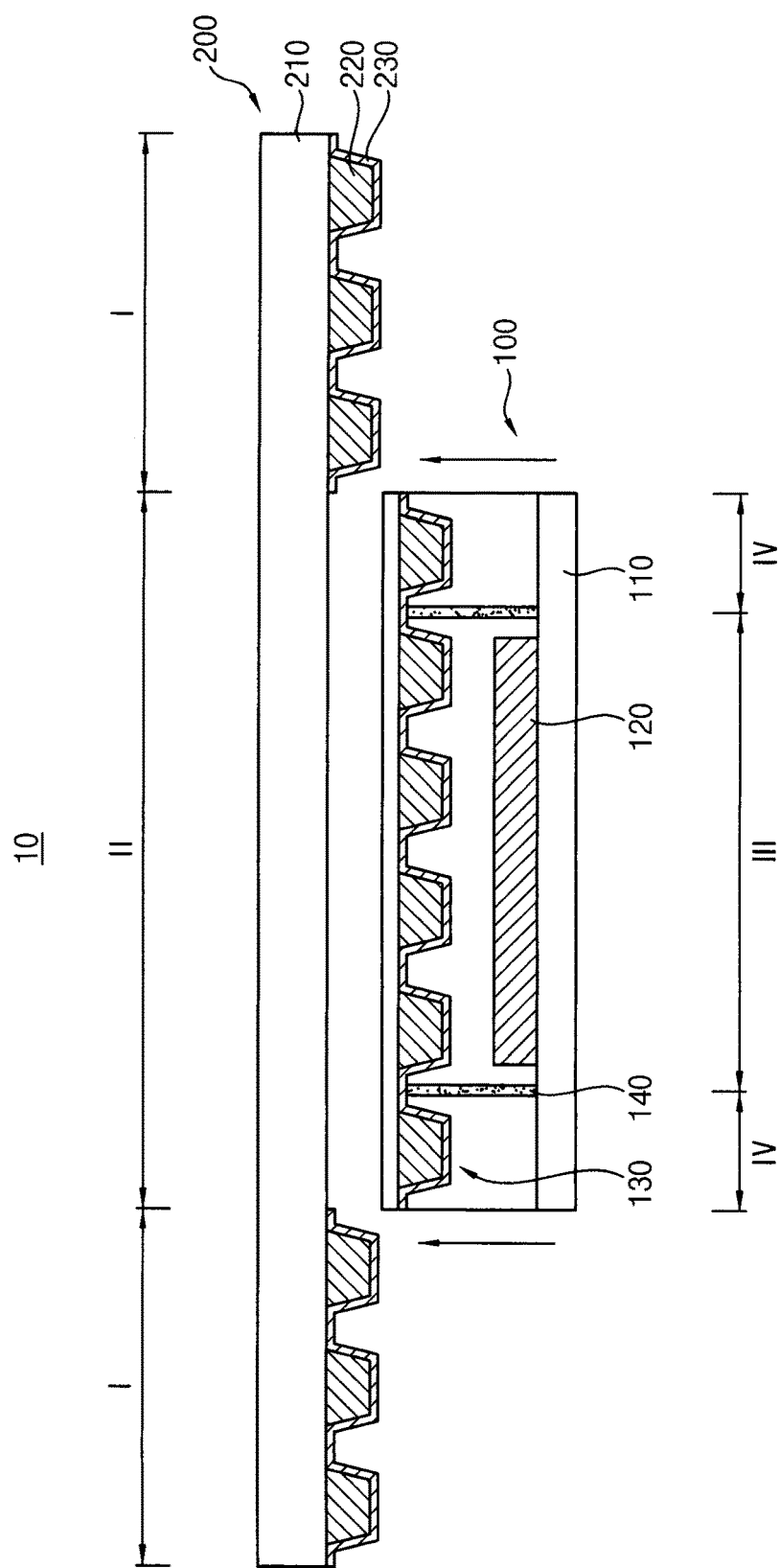
Figure 13:
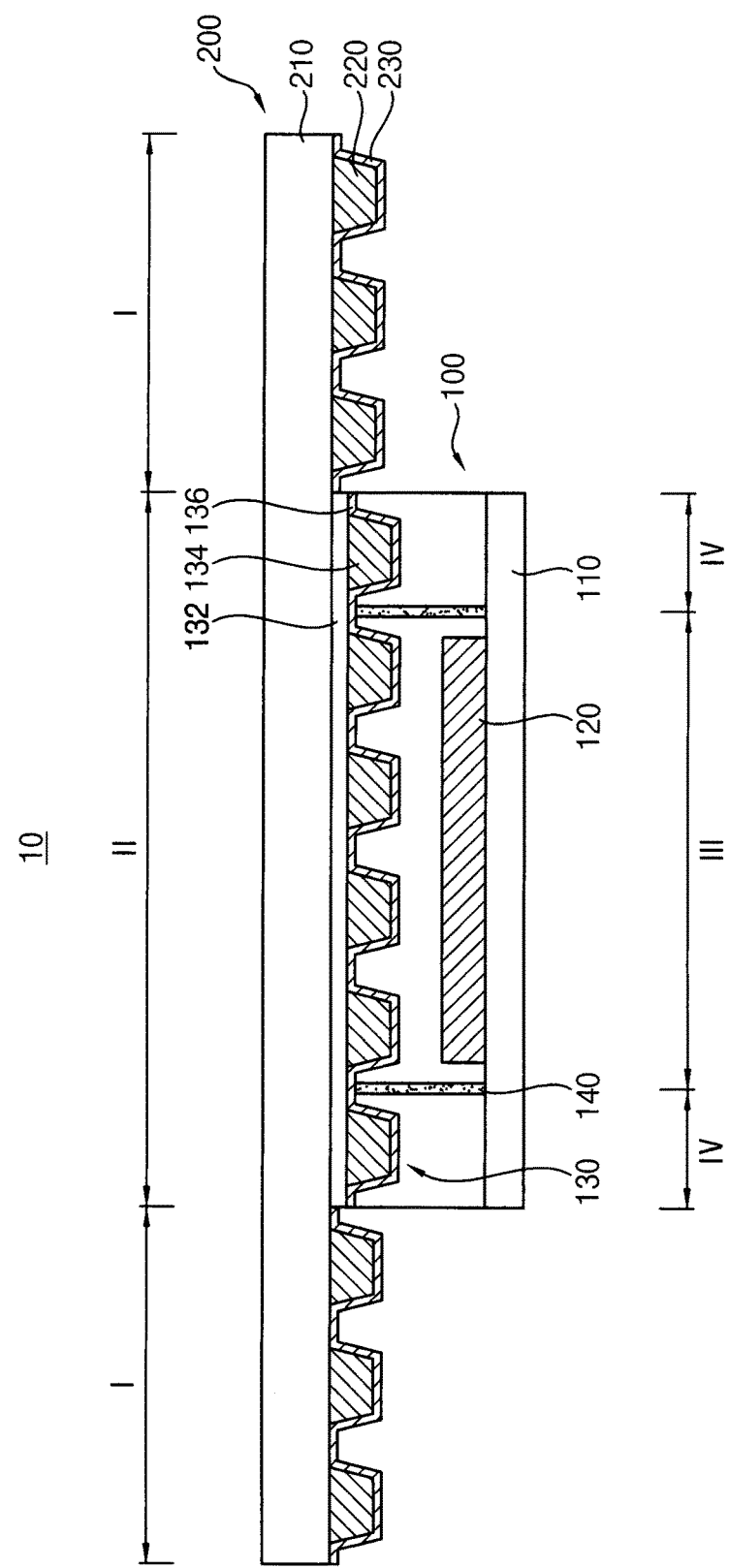

Referring to FIGS. 12 and 13, the mirror module 200 illustrated in FIG. 6 may be combined with the display module 100 illustrated in FIG. 11. The second region II of the transparent substrate 210 overlaps the display module 100 to manufacture a mirror display device 10. For example, a transparent adhesive layer may be provided on a lower surface of the transparent substrate 210 in the second region II. The display module 100 may be adhered to the transparent adhesive layer to be combined with the mirror module 200.

In an exemplary embodiment, a size of the mirror display device 10 may be increased by increasing a size of the mirror module 200. Accordingly, a size of the display module 100 may be arbitrarily adjusted. Increasing a size of the mirror module 200 may be relatively easy compared to increasing a size of the display module 100. Thus, a size of the mirror display device 10 may be easily increased according to the exemplary embodiment described herein.

Figure 14:
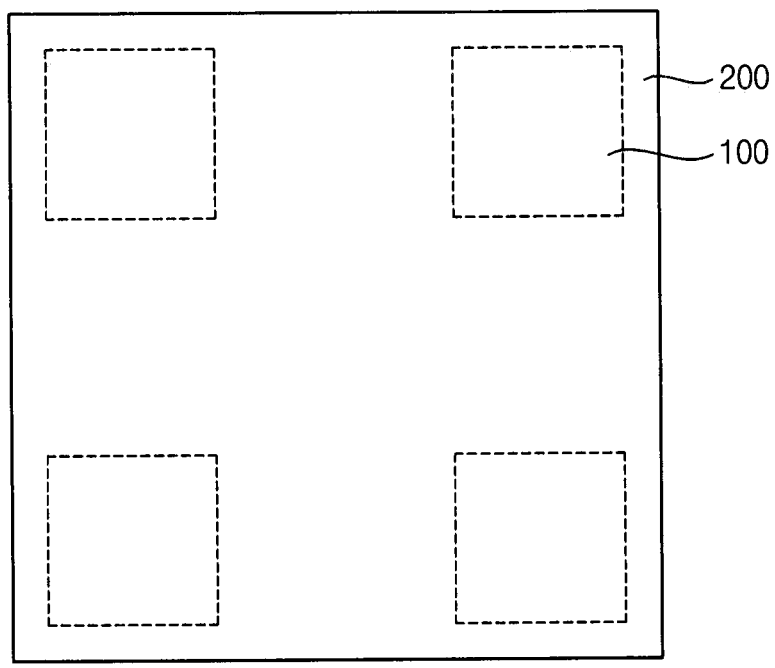

Referring to FIG. 14, a mirror display device may include one mirror module 200 and a plurality of display modules 100 combined with the mirror module 200 when the mirror module 200 is large. For example, the mirror display device may include may include four display modules 100 such that each of the display modules 100 is disposed at a corner of the mirror display device, however, the present disclosure is not limited thereto. In another exemplary embodiment, the mirror display device may include any number of display modules.

Figure 15:
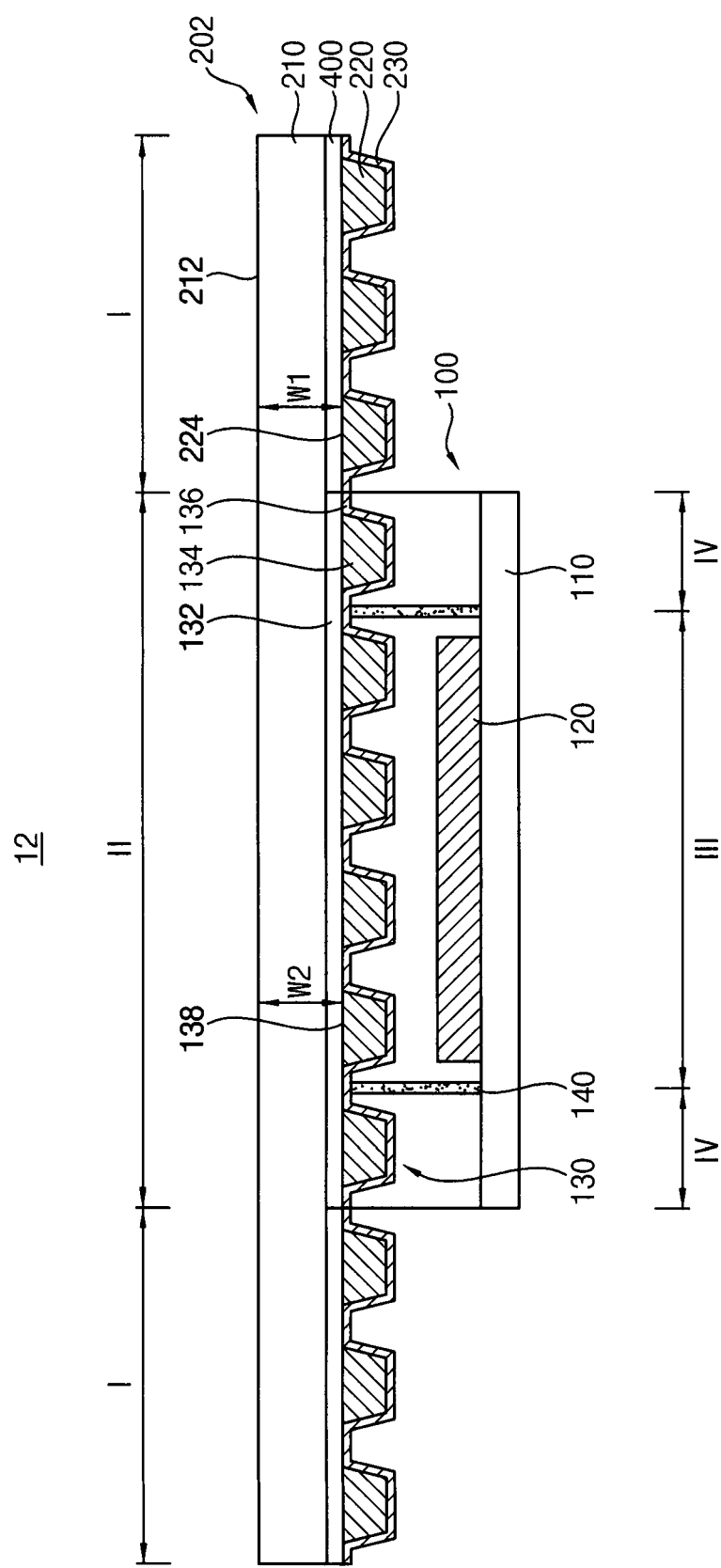

FIG. 15 is a cross-sectional view illustrating a mirror display device, according to an exemplary embodiment. The mirror display device may be substantially same as the mirror display device 10 illustrated in FIG. 1 except for further including a phase compensation layer. Thus, same reference numerals may be used for same elements in the drawings, and repeated explanation may be omitted.

Referring to FIG. 15, a mirror display device 12 includes a display module 100 and a mirror module 202. The display module 100 includes a substrate 110, a display part 120 disposed on the substrate 110, and a mirror substrate 130. The display part 120 is disposed between the substrate 110 and the mirror substrate 130.

The mirror module 202 includes a transparent substrate 210 including a second region II, a plurality of first mirror patterns 220 disposed in a first region I of the transparent substrate 210 that is adjacent to the second region II. A first mirror layer 230 continuously extends along the first mirror patterns 220.

The transparent substrate 210 may be divided into the first region I and the second region II. The second region II of the transparent substrate 210 may overlap the display module 100, and may function as a display and a mirror. The first region I of the transparent substrate 210 may be adjacent to the second region II, and may function as a mirror. The transparent substrate 210 may include a glass substrate, a transparent plastic substrate, or the like. The transparent substrate 210 may support the first mirror patterns 220, the first mirror layer 230, and the display module 100.

The first mirror patterns 220 may be disposed in the first region I of the transparent substrate 210. For example, the first mirror patterns 220 may have a grid shape, a linear shape, a mesh shape or an island shape, and may have a substantially uniform spacing therebetween.

The first mirror layer 230 may be disposed on a substantially entire portion of the first region I of the transparent substrate 210 to cover the first mirror patterns 220. In an exemplary embodiment, the first mirror layer 230 may continuously extend in the first region I of the transparent substrate 210. The first mirror layer 230 may contact a lower surface of the transparent substrate 210, and the first mirror patterns 220.

The display part 120 may include a switching element disposed on the substrate 110, and a display element electrically connected to the switching element. The substrate 110 may include a glass substrate, a transparent plastic substrate, a flexible plastic substrate, or the like.

The mirror substrate 130 may include a base substrate 132, a plurality of second mirror patterns 134, and a second mirror layer 136. The second mirror patterns 134 may be disposed under the base substrate 132, and may correspond to the first mirror patterns 220. The second mirror layer 136 may extend along the second mirror patterns 134, and may correspond to the first mirror layer 230.

In exemplary embodiment, the base substrate 132 may be divided into a third region III and a fourth region IV. The third region III may overlap a pixel area of the display module 100. The third region III may further overlap a portion of a peripheral area, for example, when the mirror substrate 130 is provided as an encapsulation substrate for the display module 100. The fourth region IV may overlap a wiring area in which a wiring providing a power to the display module 100 is provided.

The second mirror patterns 134 may be disposed in the third region III and the fourth region IV of the base substrate 132. For example, the second mirror patterns 134 may have a grid shape, a linear shape, a mesh shape or an island shape, and may have a substantially uniform spacing therebetween.

The second mirror layer 136 may be disposed under the base substrate 132 to cover the second mirror patterns 134. In an exemplary embodiment, the second mirror layer 136 may extend to be continuously disposed in the third region III and the fourth region IV of the base substrate 132.

A sealing part 140 may be disposed on a boundary between the third region III and the fourth region IV. The sealing part 140 may be disposed under the second mirror layer 136. The display module 100 may be combined with the mirror module 202 so that the base substrate 132 may be spaced apart from the transparent substrate 210 of the mirror module 202.

In an exemplary embodiment, the mirror module 202 may further include a phase compensation layer 400 that is interposed between the first mirror patterns 220 and the transparent substrate 210 in the first region I. The phase compensation layer 400 may include a material substantially same as the transparent substrate 210.

The phase compensation layer 400 may have a thickness such that a distance W1 between a first surface 212 of the transparent substrate 210 and a first surface 224 of the first mirror pattern 220 is substantially same as a distance W2 between the first surface 212 of the transparent substrate 210 and a first surface 138 of the second mirror patterns 134.

In an exemplary embodiment, the mirror module 202 may include the first mirror patterns 220 and the first mirror layer 230, and the display module 100 may include the second mirror patterns 134 and the second mirror layer 136. Thus, the mirror module 202 may have a similar or same mirror structure as the display module 100. Therefore, problems such as image blurring, image separation or the like may be reduced and/or prevented.

In an exemplary embodiment, the phase compensation layer 400 is disposed between the transparent substrate 210 and the first mirror patterns 220. Thus, a level difference of the first mirror patterns 220 and the second mirror patterns 134 may be reduced or removed. Furthermore, a phase difference between a light reflected by the first mirror patterns 220 and the first mirror layer 230 and a light reflected by the second mirror patterns 134 and the second mirror layer 136 may be reduced or removed.

According to an exemplary embodiment, the mirror display device 12 may include the mirror module 202 and the display module 100 combined with the mirror module 202. Thus, a large-sized mirror display device may be effectively achieved. Furthermore, deterioration of display quality may be reduced and/or prevented.

FIGS. 16 to 21 are cross-sectional views illustrating a method of manufacturing a mirror display device, according to an exemplary embodiment. For example, FIGS. 16 to 21 may be cross-sectional views illustrating a method of manufacturing the mirror display device 12 illustrated in FIG. 15. Explanation for a process or a material that is substantially same as those explained with reference to FIGS. 4 to 13, may be omitted.

Figure 16:
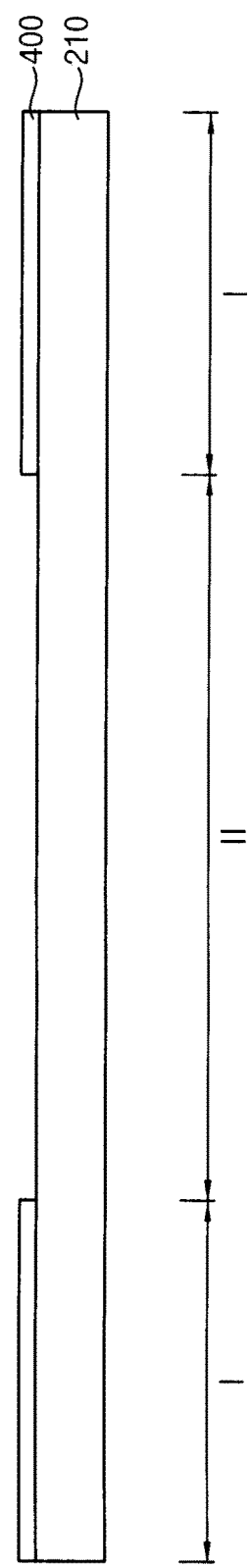

Referring to FIG. 16, a phase compensation layer 400 may be disposed in a first region I of a transparent substrate 210. The phase compensation layer 400 may include a material substantially same as the transparent substrate 210. In an exemplary embodiment, an adhesive may be provided on the transparent substrate 210, and the phase compensation layer 400 may be provided on the adhesive.

Figure 17:
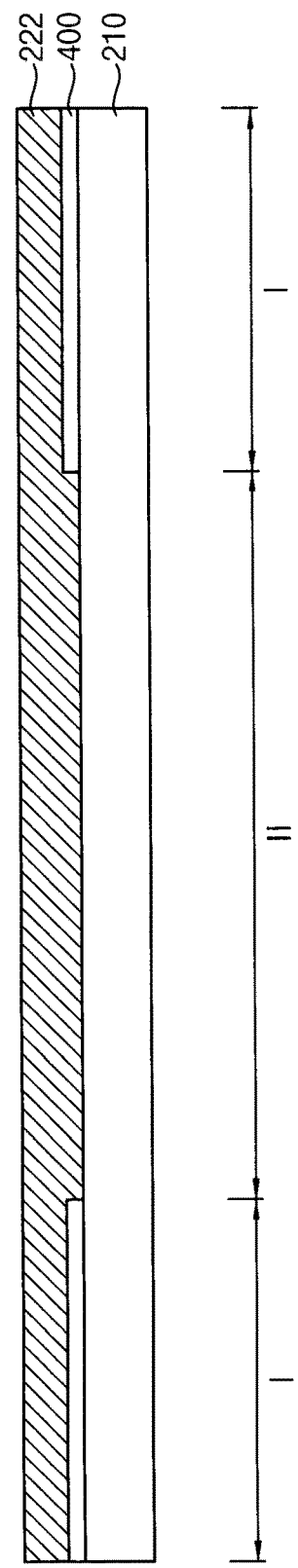

Referring to FIG. 17, a metal layer 222 may be disposed on a transparent substrate 210. The transparent substrate 210 may include a glass substrate, a transparent plastic substrate, or the like. The transparent substrate 210 may be divided into a first region I and a second region II. The first region I and the second region II may be defined respectively by a peripheral portion and a central portion of the transparent substrate 210.

Figure 18:
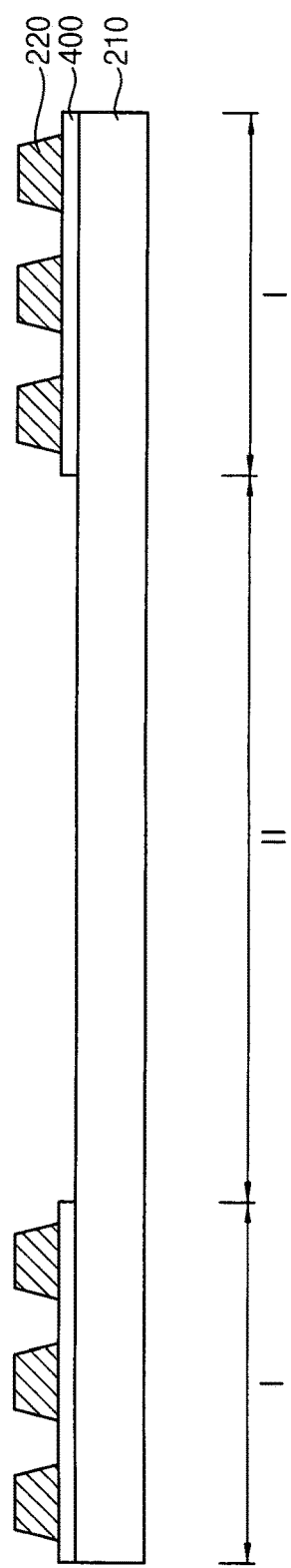

Referring to FIG. 18, the metal layer 222 may be patterned, for example, through a photolithography process, to form a plurality of first mirror patterns 220. For example, the first mirror patterns 220 may be disposed in the first region I of the transparent substrate 210. The first mirror patterns 220 may have a grid shape, a linear shape, a mesh shape, or an island shape, and may have a substantially uniform spacing therebetween.

Figure 19:
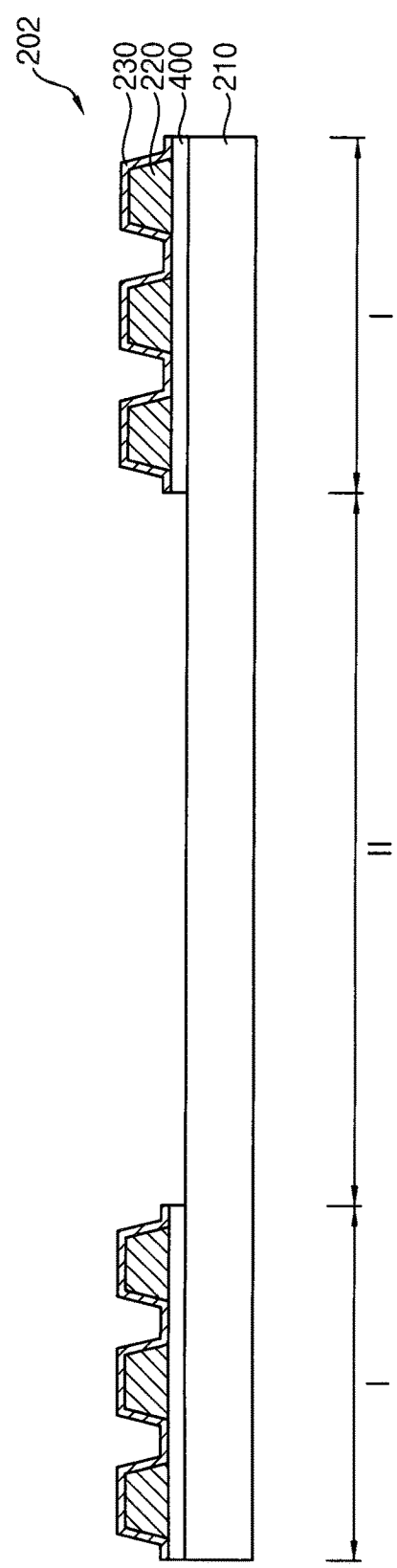

Referring to FIG. 19, a first mirror layer 230 is disposed on an upper surface of the phase compensation layer 400 and on the first mirror patterns 220 to form a mirror module 202. A thickness of the first mirror layer 230 may be less than a thickness of the first mirror patterns 220. In an exemplary embodiment, the first mirror layer 230 covers the first mirror patterns 210, and may be conformally disposed on the phase compensation layer 400.

Figure 20:
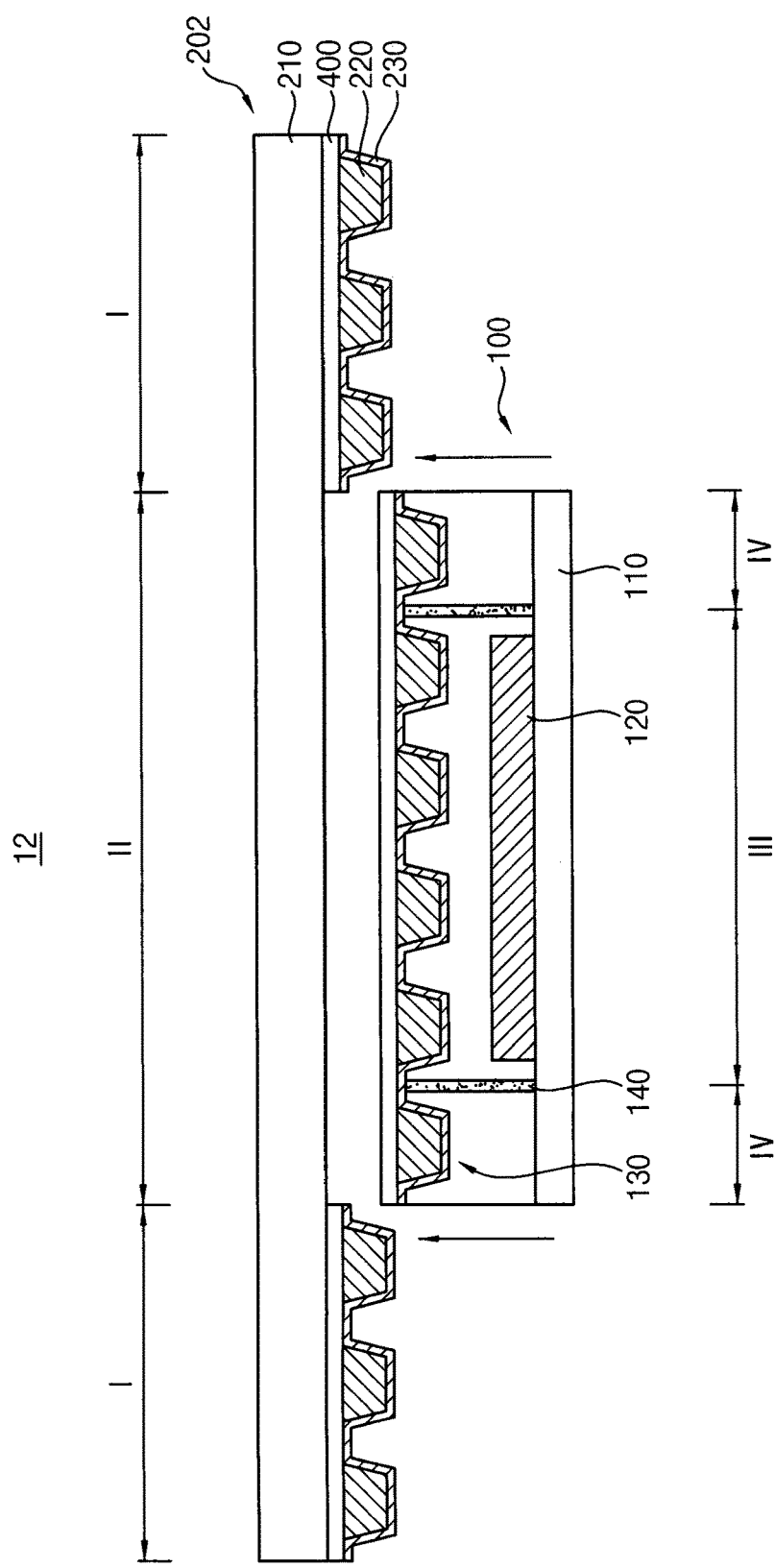
Figure 21:
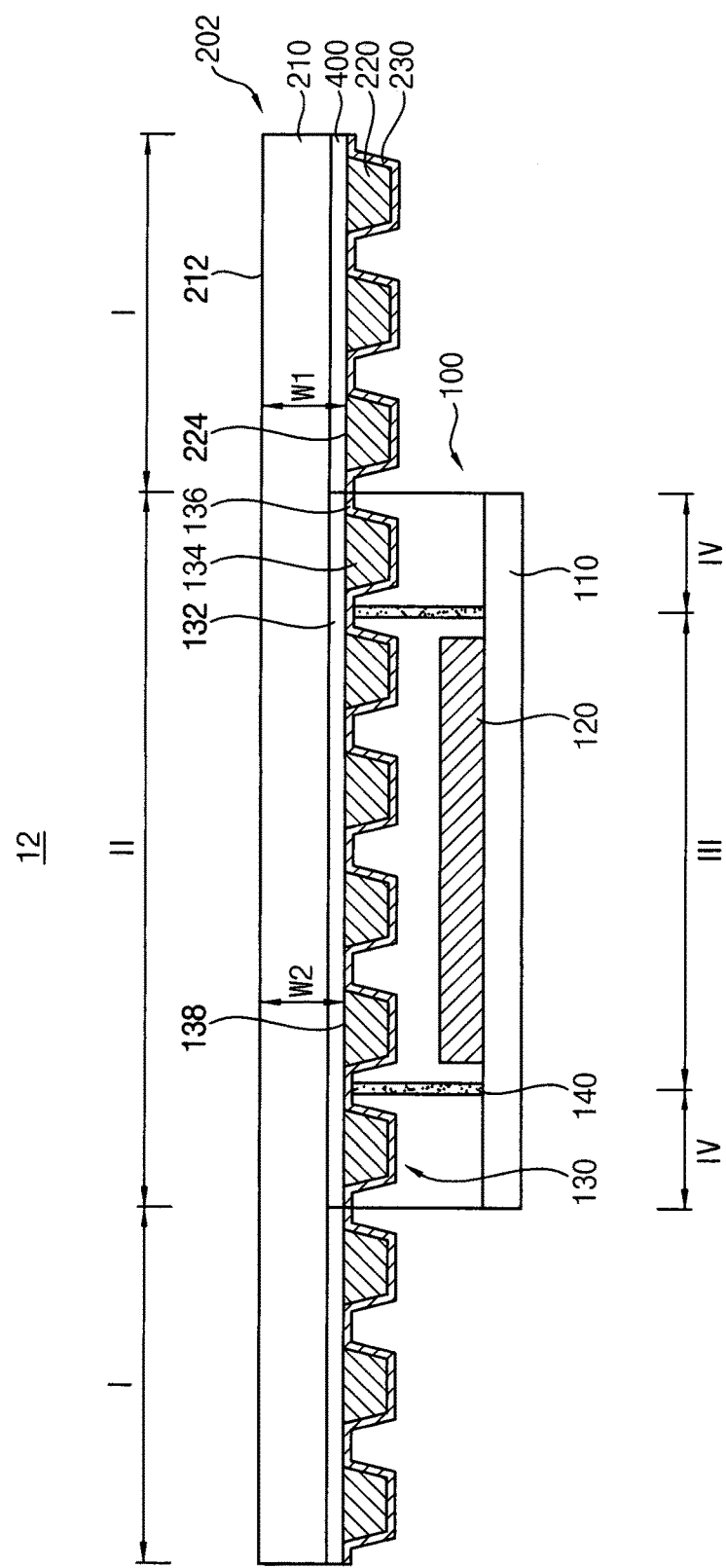

Referring to FIGS. 20 and 21, the mirror module 202 illustrated in FIG. 18 may be combined with the display module 100 illustrated in FIG. 11. The second region II of the transparent substrate 210 overlaps the display module 100 to manufacture a mirror display device 12. For example, a transparent adhesive layer may be provided on a lower surface of the transparent substrate 210 in the second region II. The display module 100 may be adhered to the transparent adhesive layer to be combined with the mirror module 202.

In an exemplary embodiment, a size of the mirror display device 12 may be increased by increasing a size of the mirror module 202. Accordingly, a size of the display module 100 may be arbitrarily adjusted. Increasing a size of the mirror module 202 may be relatively easy compared to increasing a size of the display module 100. Thus, a size of the mirror display device 12 may be easily increased according to the exemplary embodiment described herein.

Figure 22:
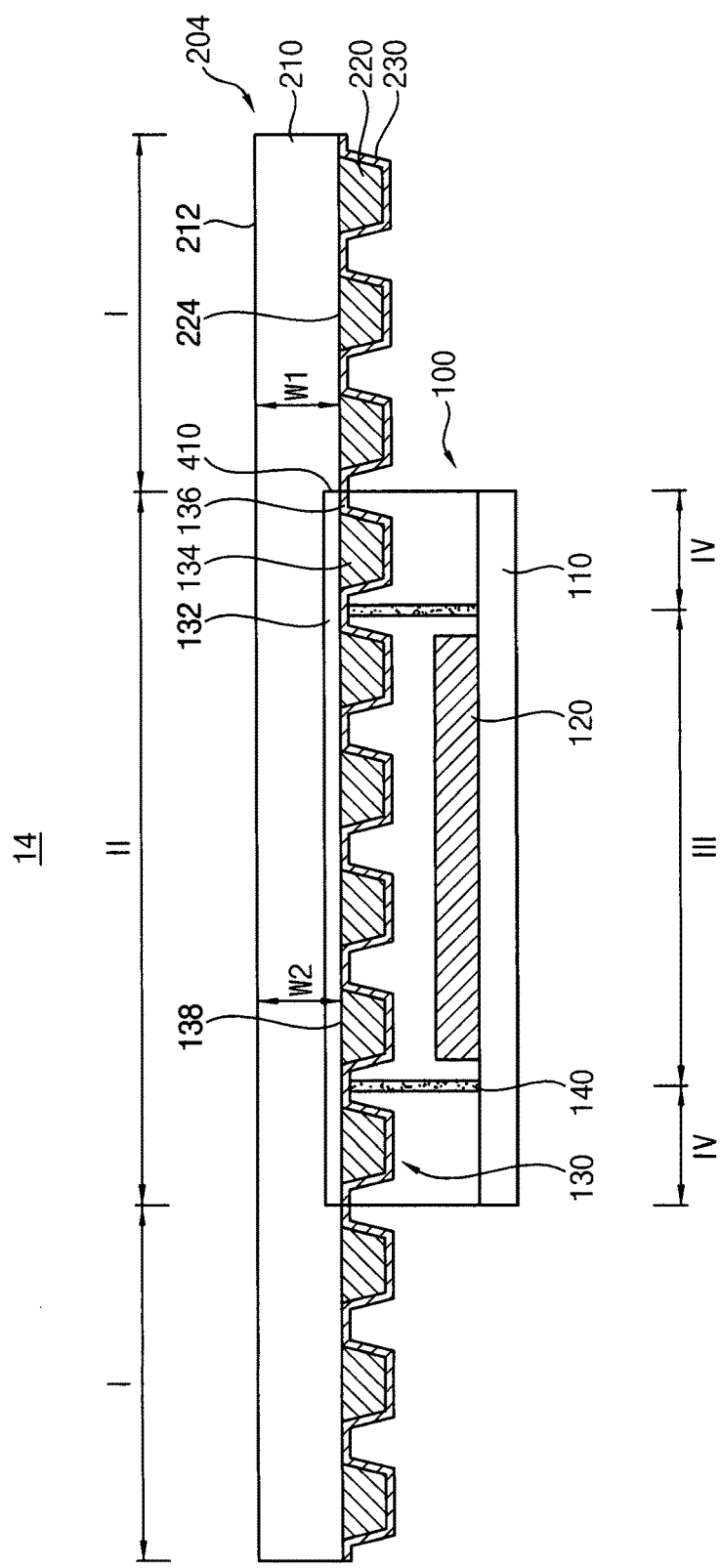

FIG. 22 is a cross-sectional view illustrating a mirror display device, according to an exemplary embodiment. The mirror display device may be substantially same as the mirror display device 10 illustrated in FIG. 1 except for having a recess formed in a mirror module. Thus, same reference numerals may be used for same elements in the drawings, and any repeated explanation may be omitted.

Referring to FIG. 22, a mirror display device 14 includes a display module 100 and a mirror module 204. The display module 100 includes a substrate 110, a display part 120 disposed on the substrate 110, and a mirror substrate 130. The display part 120 is disposed between the substrate 110 and the mirror substrate 130.

The mirror module 204 includes a transparent substrate 210 including a second region II, a plurality of first mirror patterns 220 disposed in a first region I of the transparent substrate 210 that is adjacent to the second region II. A first mirror layer 230 continuously extends along the first mirror patterns 220.

The transparent substrate 210 may be divided into the first region I and the second region II. The second region II of the transparent substrate 210 may overlap the display module 100, and may function as a display and a mirror. The first region I of the transparent substrate 210 may be adjacent to the second region II, and may function as a mirror. The transparent substrate 210 may include a glass substrate, a transparent plastic substrate, or the like. The transparent substrate 210 may support the first mirror patterns 220, the first mirror layer 230, and the display module 100.

The first mirror patterns 220 may be disposed in the first region I of the transparent substrate 210. For example, the first mirror patterns 220 may have a grid shape, a linear shape, a mesh shape or an island shape, and may have a substantially uniform spacing therebetween.

The first mirror layer 230 may be disposed on a substantially entire portion of the first region I of the transparent substrate 210 to cover the first mirror patterns 220. In an exemplary embodiment, the first mirror layer 230 may continuously extend in the first region I of the transparent substrate 210. The first mirror layer 230 may contact a lower surface of the transparent substrate 210, and the first mirror patterns 220.

The display part 120 may include a switching element disposed on the substrate 110, and a display element electrically connected to the switching element. The substrate 110 may include a glass substrate, a transparent plastic substrate, a flexible plastic substrate, or the like.

The mirror substrate 130 may include a base substrate 132, a plurality of second mirror patterns 134, and a second mirror layer 136. The second mirror patterns 134 may be disposed under the base substrate 132, and may correspond to the first mirror patterns 220. The second mirror layer 136 may extend along the second mirror patterns 134, and may correspond to the first mirror layer 230.

In exemplary embodiment, the base substrate 132 may be divided into a third region III and a fourth region IV. The third region III may overlap a pixel area of the display module 100. The third region III may further overlap a portion of a peripheral area, for example, when the mirror substrate 130 is provided as an encapsulation substrate for the display module 100. The fourth region IV may overlap a wiring area in which a wiring providing a power to the display module 100 is provided.

The second mirror patterns 134 may be disposed in the third region III and the fourth region IV of the base substrate 132. For example, the second mirror patterns 134 may have a grid shape, a linear shape, a mesh shape or an island shape, and may have a substantially uniform spacing therebetween.

The second mirror layer 136 may be disposed under the base substrate 132 to cover the second mirror patterns 134. In an exemplary embodiment, the second mirror layer 136 may extend to be continuously disposed in the third region III and the fourth region IV of the base substrate 132.

A sealing part 140 may be disposed on a boundary between the third region III and the fourth region IV. The sealing part 140 may be disposed under the second mirror layer 136. The display module 100 may be combined with the mirror module 204 so that the base substrate 132 may be spaced apart from the transparent substrate 210 of the mirror module 204.

In an exemplary embodiment, the mirror module 204 may have a recess 410 disposed in the second region II of the transparent substrate 210 for receiving the display module 100.

In an exemplary embodiment, a width of the recess 410 may be substantially same as a width of the second region II of the transparent substrate 210. The recess 410 may have a depth such that a distance W1 between a first surface 212 of the transparent substrate 210 and a first surface 224 of the first mirror pattern 220 is substantially same as a distance W2 between the first surface 212 of the transparent substrate 210 and a first surface 138 of the second mirror patterns 134.

In an exemplary embodiment, the mirror module 204 may include the first mirror patterns 220 and the first mirror layer 230, and the display module 100 may include the second mirror patterns 134 and the second mirror layer 136. Thus, the mirror module 204 may have a similar or same mirror structure as the display module 100. Therefore, problems such as image blurring, image separation or the like may be reduced and/or prevented.

In an exemplary embodiment, the transparent substrate 210 of the mirror module 204 has the recess 410 that receives the display module 100. Thus, a level difference of the first mirror patterns 220 and the second mirror patterns 134 may be reduced or removed. Furthermore, a phase difference between a light reflected by the first mirror patterns 220 and the first mirror layer 230 and a light reflected by the second mirror patterns 134 and the second mirror layer 136 may be reduced or removed.

According to an exemplary embodiment, the mirror display device 14 may include the mirror module 204 and the display module 100 combined with the mirror module 204. Thus, a large-sized mirror display device may be effectively achieved. Furthermore, deterioration of display quality may be reduced and/or prevented.

FIGS. 23 to 28 are cross-sectional views illustrating a method of manufacturing a mirror display device, according to an exemplary embodiment. For example, FIGS. 23 to 28 may be cross-sectional views illustrating a method of manufacturing the mirror display device 14 illustrated in FIG. 22. Explanation for a process or a material that is substantially same as those explained with reference to FIGS. 4 to 13, may be omitted.

Figure 23:
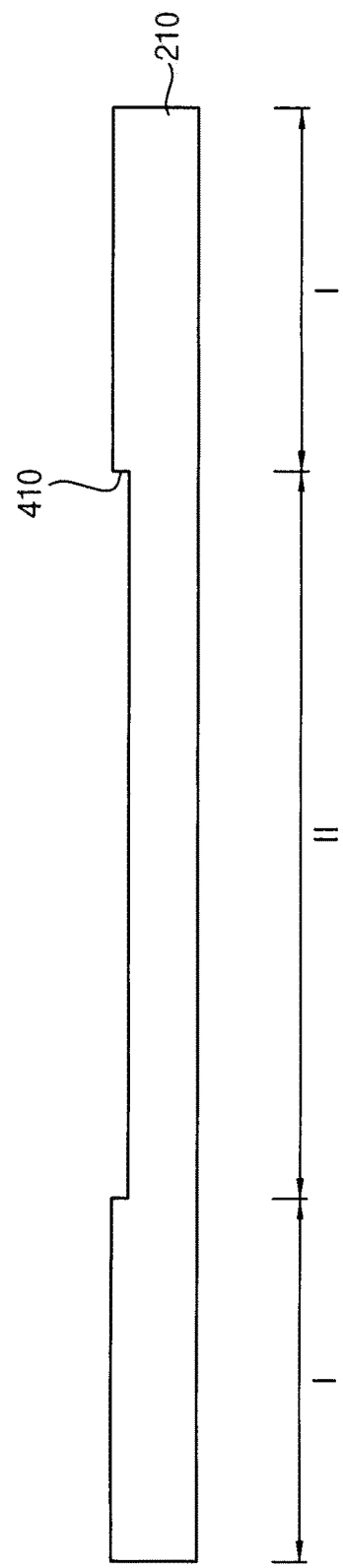

Referring to FIG. 23, a recess 410 may be formed in a second region II of a transparent substrate 210. For example, the recess 410 may be formed in the second region II of the transparent substrate 210 through a mechanical drilling process, a laser drilling process, or the like.

Figure 24:
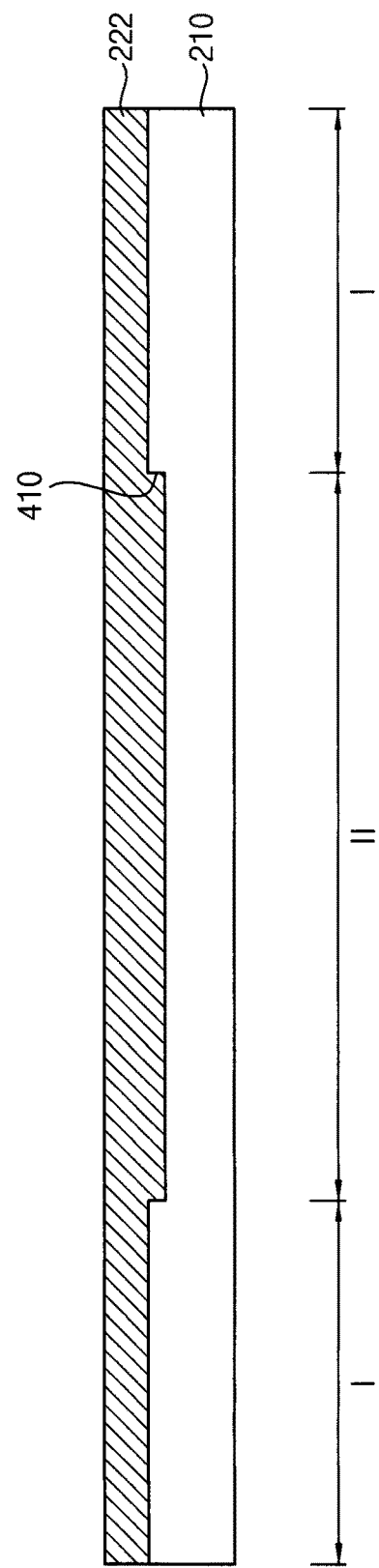

Referring to FIG. 24, a metal layer 222 may be disposed on a transparent substrate 210. The transparent substrate 210 may include a glass substrate, a transparent plastic substrate, or the like. The transparent substrate 210 may be divided into a first region I and a second region II. The first region I and the second region II may be defined respectively by a peripheral portion and a central portion of the transparent substrate 210.

Figure 25:
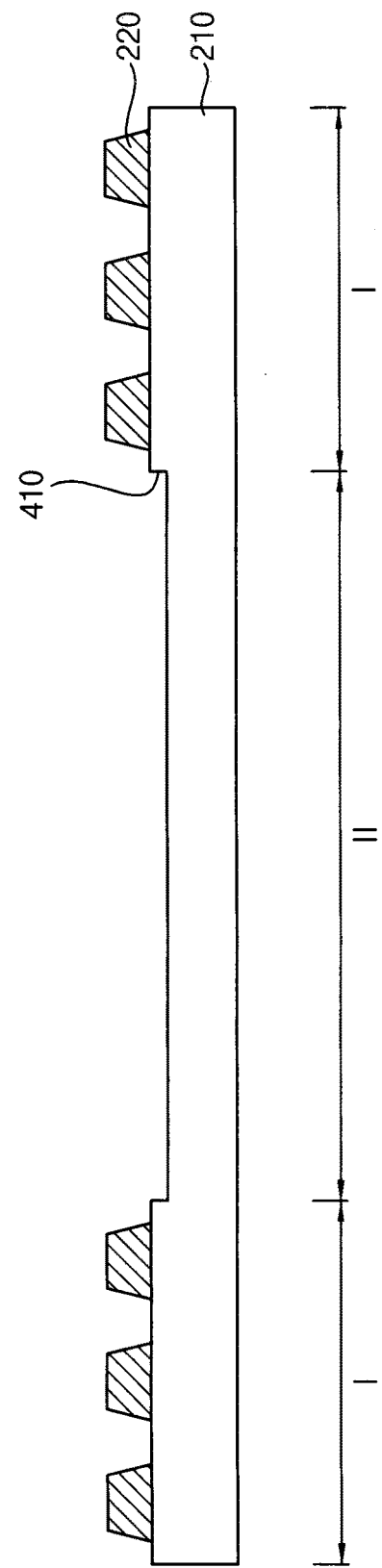

Referring to FIG. 25, the metal layer 222 may be patterned, for example, through a photolithography process, to form a plurality of first mirror patterns 220. For example, the first mirror patterns 220 may be disposed in the first region I of the transparent substrate 210. The first mirror patterns 220 may have a grid shape, a linear shape, a mesh shape, or an island shape, and may have a substantially uniform spacing therebetween.

Figure 26:
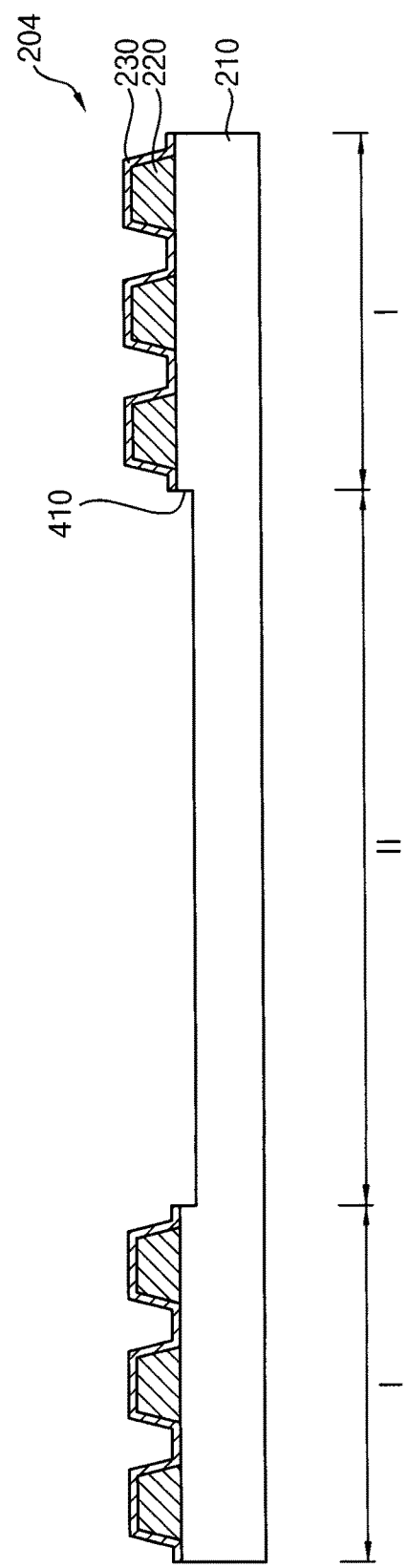

Referring to FIG. 26, a first mirror layer 230 is disposed on an upper surface of the phase compensation layer 400 and on the first mirror patterns 220 to form a mirror module 204. A thickness of the first mirror layer 230 may be less than a thickness of the first mirror patterns 220. In an exemplary embodiment, the first mirror layer 230 covers the first mirror patterns 210, and may be conformally disposed in the first region I of the transparent substrate 210.

Figure 27:
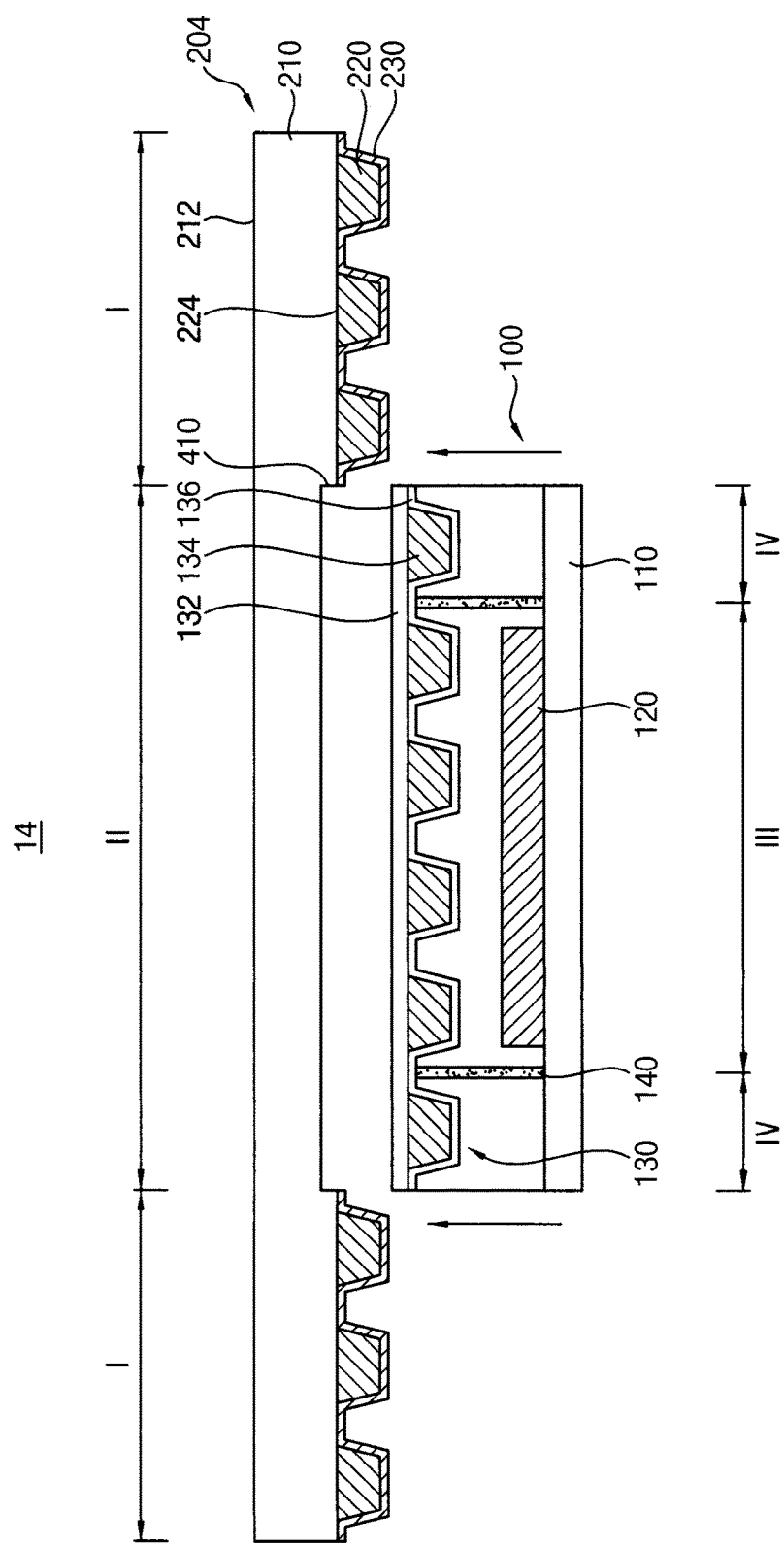
Figure 28:
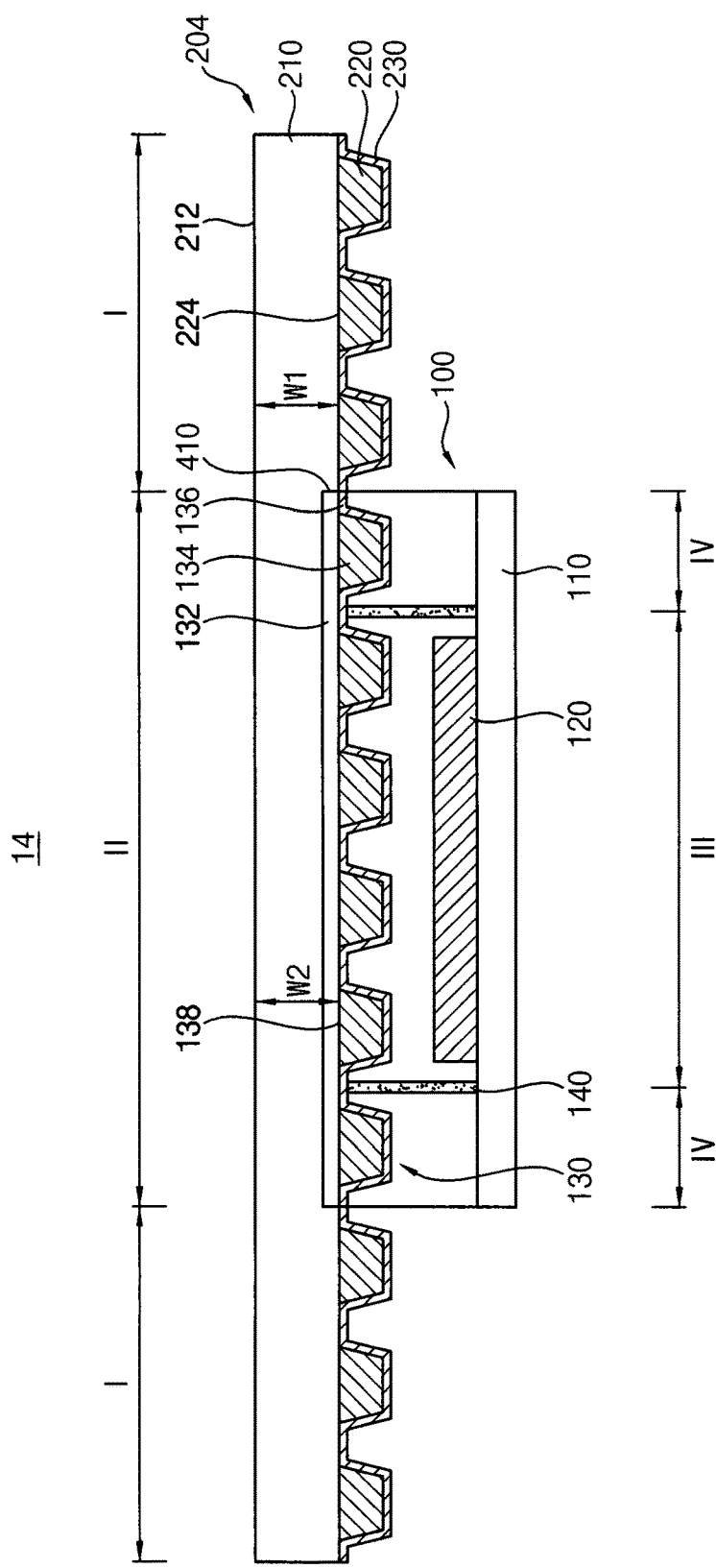

Referring to FIGS. 27 and 28, the mirror module 204 illustrated in FIG. 25 may be combined with the display module 100 illustrated in FIG. 11. The second region II of the transparent substrate 210 overlaps the display module 100 to manufacture a mirror display device 14. For example, a transparent adhesive layer may be provided on a lower surface of the transparent substrate 210 in the second region II. The display module 100 may be adhered to the transparent adhesive layer to be combined with the mirror module 204.

In an exemplary embodiment, a size of the mirror display device 14 may be increased by increasing a size of the mirror module 204. Accordingly, a size of the display module 100 may be arbitrarily adjusted. Increasing a size of the mirror module 204 may be relatively easy compared to increasing a size of the display module 100. Thus, a size of the mirror display device 14 may be easily increased according to the exemplary embodiment described herein.

Figure 29:
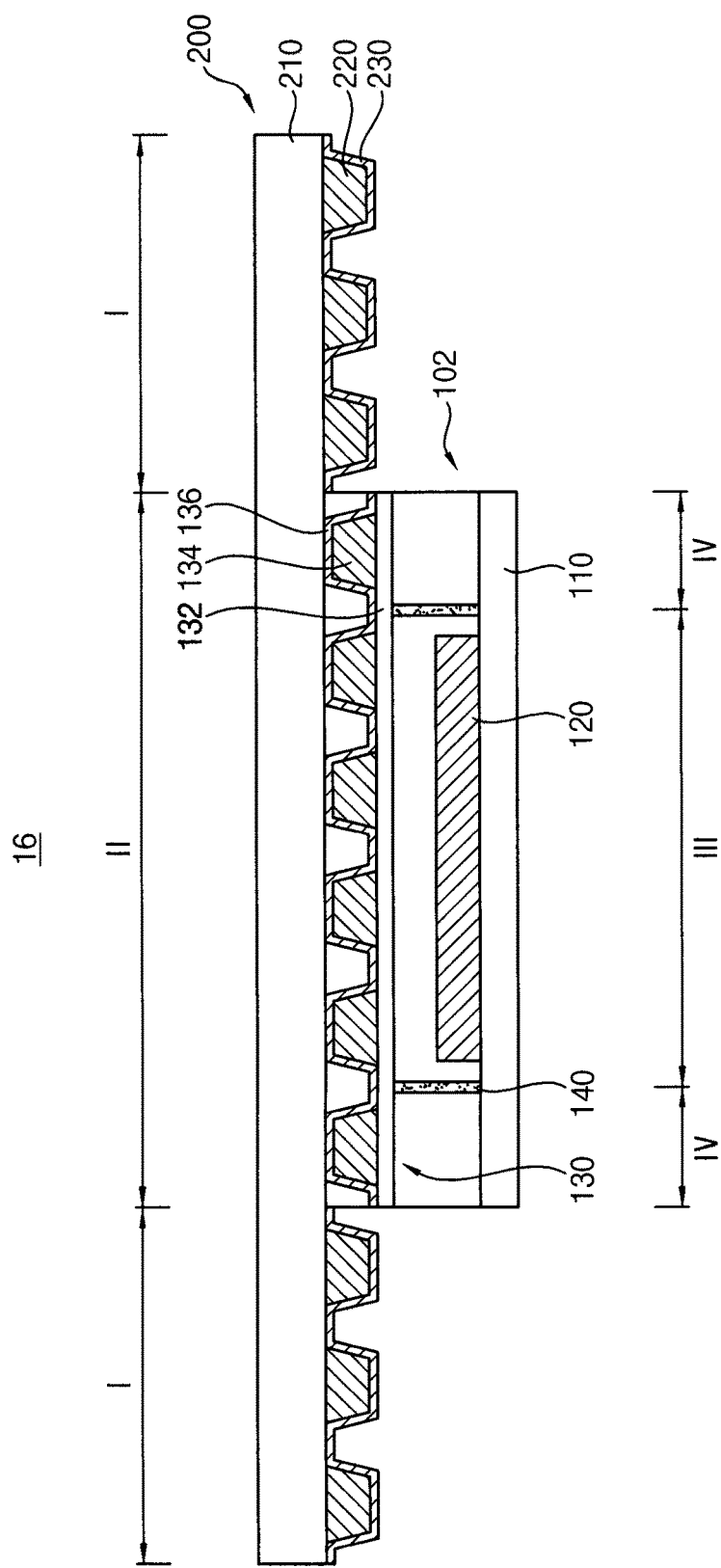

FIG. 29 is a cross-sectional view illustrating a mirror display device according to an exemplary embodiment. The mirror display device may be substantially same as the mirror display device 10 illustrated in FIG. 1 except that second mirror patterns and a second mirror layer are disposed on a different surface of a base substrate. Thus, same reference numerals may be used for same elements in the drawings, and any repeated explanation may be omitted.

Referring to FIG. 29, a mirror display device 16 includes a display module 102 and a mirror module 200. The display module 102 includes a substrate 110, a display part 120 disposed on the substrate 110, and a mirror substrate 130. The display part 120 is disposed between the substrate 110 and the mirror substrate 130.

The mirror module 200 includes a transparent substrate 210 including a second region II, a plurality of first mirror patterns 220 disposed in a first region I of the transparent substrate 210 that is adjacent to the second region II. A first mirror layer 230 continuously extends along the first mirror patterns 220.

The transparent substrate 210 may be divided into the first region I and the second region II. The second region II of the transparent substrate 210 may overlap the display module 102, and may function as a display and a mirror. The first region I of the transparent substrate 210 may be adjacent to the second region II, and may function as a mirror. The transparent substrate 210 may include a glass substrate, a transparent plastic substrate or the like. The transparent substrate 210 may support the first mirror patterns 220, the first mirror layer 230, and the display module 102.

The first mirror patterns 220 may be disposed in the first region I of the transparent substrate 210. For example, the first mirror patterns 220 may have a grid shape, a linear shape, a mesh shape or an island shape, and may have a substantially uniform spacing therebetween.

The first mirror layer 230 may be disposed on a substantially entire portion of the first region I of the transparent substrate 210 to cover the first mirror patterns 220. In an exemplary embodiment, the first mirror layer 230 may continuously extend in the first region I of the transparent substrate 210. The first mirror layer 230 may contact a lower surface of the transparent substrate 210, and the first mirror patterns 220.

The display part 120 may include a switching element disposed on the substrate 110, and a display element electrically connected to the switching element. The substrate 110 may include a glass substrate, a transparent plastic substrate, a flexible plastic substrate, or the like.

The mirror substrate 130 may include a base substrate 132, a plurality of second mirror patterns 134, and a second mirror layer 136. The second mirror patterns 134 may be disposed under the base substrate 132, and may correspond to the first mirror patterns 220. The second mirror layer 136 may extend along the second mirror patterns 134, and may correspond to the first mirror layer 230.

In exemplary embodiment, the base substrate 132 may be divided into a third region III and a fourth region IV. The third region III may overlap a pixel area of the display module 102. The third region III may further overlap a portion of a peripheral area, for example, when the mirror substrate 130 is provided as an encapsulation substrate for the display module 102. The fourth region IV may overlap a wiring area in which a wiring providing a power to the display module 102 is provided.

The second mirror patterns 134 may be disposed in the third region III and the fourth region IV of the base substrate 132. For example, the second mirror patterns 134 may have a grid shape, a linear shape, a mesh shape or an island shape, and may have a substantially uniform spacing therebetween.

The second mirror layer 136 may be disposed on the base substrate 132 to cover the second mirror patterns 134. In an exemplary embodiment, the second mirror layer 136 may extend to be continuously disposed in the third region III and the fourth region IV of the base substrate 132.

A sealing part 140 may be disposed on a boundary between the third region III and the fourth region IV. The sealing part 140 may be disposed under the base substrate 132. The display module 102 may be combined with the mirror module 200 so that the second mirror patterns 134 may face the transparent substrate 210 of the mirror module 200.

In an exemplary embodiment, the mirror module 200 may include the first mirror patterns 220 and the first mirror layer 230, and the display module 102 may include the second mirror patterns 134 and the second mirror layer 136. Thus, the mirror module 200 may have a similar or same mirror structure as the display module 102. Therefore, problems such as image blurring, image separation or the like may be reduced and/or prevented.

In an exemplary embodiment, the second mirror patterns 134 are disposed to face the transparent substrate 210 of the mirror module 200. Thus, a phase difference between a light reflected by the first mirror patterns 220 and the first mirror layer 230, and a light reflected by the second mirror patterns 134 and the second mirror layer 136 may be reduced or removed.

According to an exemplary embodiment, the mirror display device 16 may include the mirror module 200 and the display module 102 combined with the mirror module 200. Thus, a large-sized mirror display device may be effectively achieved. Furthermore, deterioration of display quality may be reduced and/or prevented.

Figure 30:
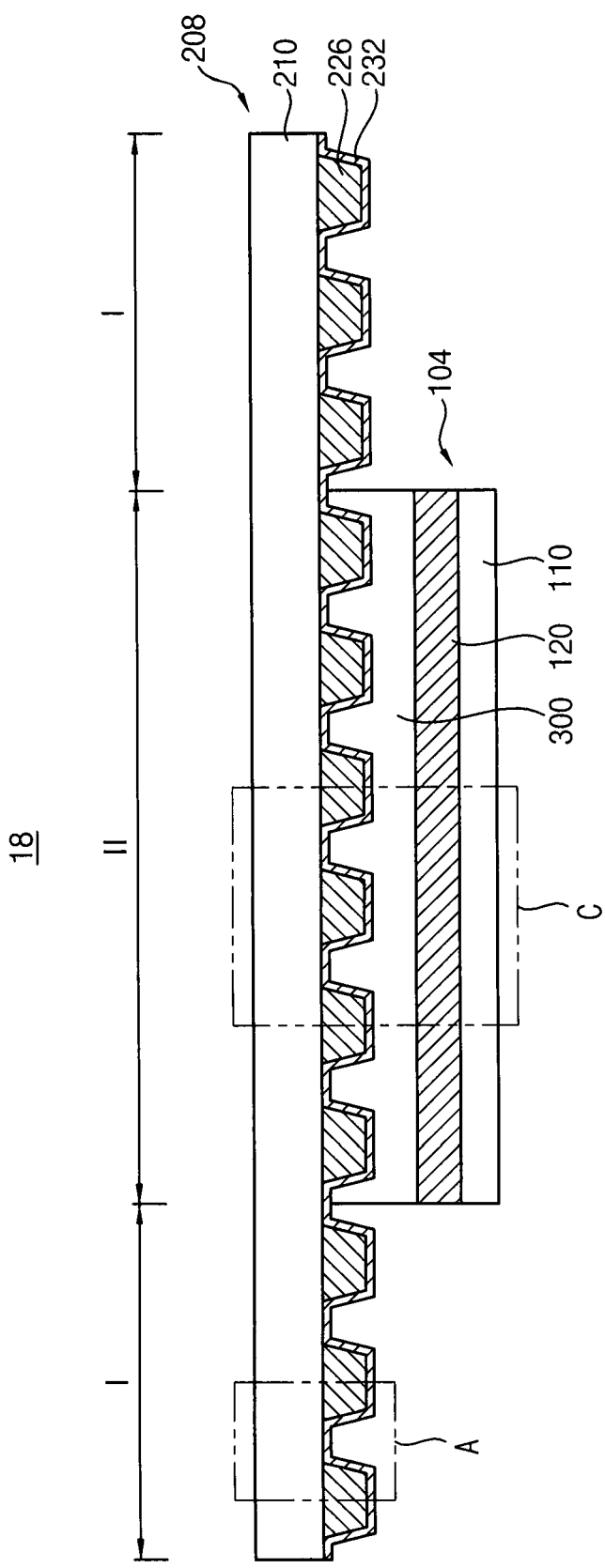
Figure 31:
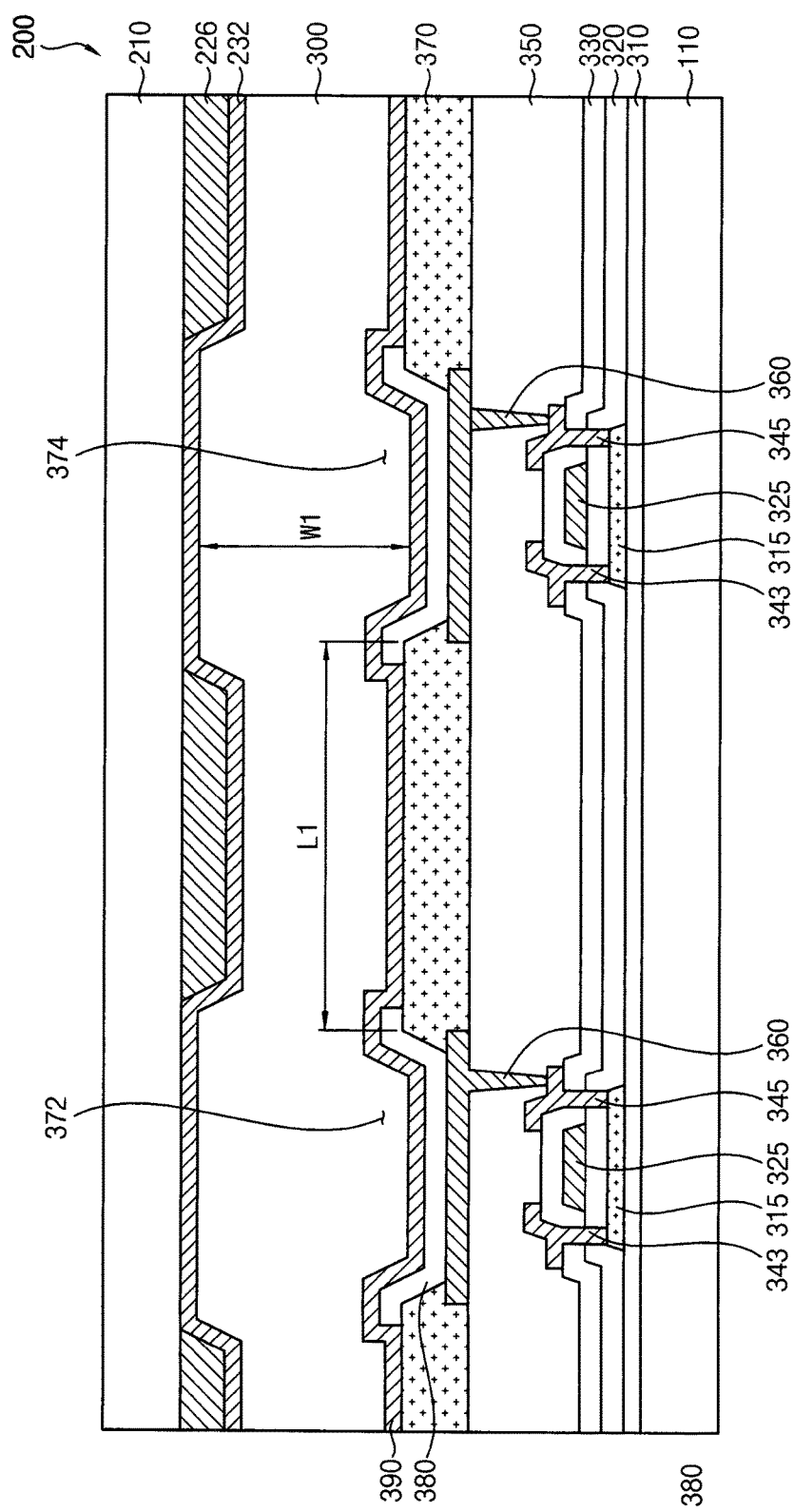

FIG. 30 is a cross-sectional view illustrating a mirror display device, according to an exemplary embodiment. FIG. 31 is an enlarged cross-sectional view illustrating the region 'C' of FIG. 30. The mirror display device may be substantially same as the mirror display device 10 illustrated in FIG. 1 except that a display module includes a thin film encapsulation layer instead of an encapsulation substrate, and that mirror patterns and a mirror layer are included in a mirror module. Thus, same reference numerals may be used for same elements in the drawings, and any repeated explanation may be omitted.

Referring to FIGS. 30 and 31, a mirror display device 18 includes a display module 104 and a mirror module 208. The display module 104 includes a substrate 110, a display part 120 disposed on the substrate 110, and a thin film encapsulation layer 300 that is disposed between the display part 120 and the mirror module 208.

The mirror module 208 includes a transparent substrate 210 including a second region II, a plurality of first mirror patterns 226 disposed in a first region I and the second region II of the transparent substrate 210. A first mirror layer 232 continuously extends along the first mirror patterns 226.

The transparent substrate 210 may be divided into the first region I and the second region II. The second region II of the transparent substrate 210 may overlap the display module 104, and may function as a display and a mirror. The first region I of the transparent substrate 210 may be adjacent to the second region II, and may function as a mirror. The transparent substrate 210 may include a glass substrate, a transparent plastic substrate, or the like. The transparent substrate 210 may support the first mirror patterns 226, the first mirror layer 232, and the display module 104.

The first mirror patterns 226 may be disposed in the first region I and the second region II of the transparent substrate 210. For example, the first mirror patterns 226 may have a grid shape, a linear shape, a mesh shape or an island shape, and may have a substantially uniform spacing therebetween.

The first mirror layer 232 may be disposed on a substantially entire portion of the first region I and the second region II of the transparent substrate 210 to cover the first mirror patterns 226. In an exemplary embodiment, the first mirror layer 232 may continuously extend in the first region I and the second region II of the transparent substrate 210. The first mirror layer 232 may contact a lower surface of the transparent substrate 210, and the first mirror patterns 226.

The display part 120 may include a plurality of switching elements disposed on the substrate 110, an insulation structure that covers the switching elements, a plurality of first electrodes 360 passing through the insulation structure to be electrically connected to the switching elements, a plurality of display layers 380 disposed on the first electrodes 360, and a second electrode 390 commonly disposed on the display layers 380. The insulation structure may include a gate insulation layer 320, an insulation interlayer 330, and a via insulation layer 350. A pixel-defining layer 370 may be disposed on the insulation structure. The pixel-defining layer 370 may have a plurality of openings 372 and 374 respectively exposing the first electrodes 360.

The thin film encapsulation layer 300 may be continuously disposed on an upper surface of the second electrode 390. For example, the thin film encapsulation layer 300 may be disposed on a profile of the second electrode 390. In an exemplary embodiment, the thin film encapsulation layer 300 may have a stacked structure in which at least one organic layer and at least one inorganic layer are alternately deposited. The inorganic layer may include silicon oxide, silicon nitride, silicon oxynitride, aluminum oxide (AlOx), aluminum nitride (AlNx), titanium oxide (TiOx), zinc oxide (ZnOx), or the like. The organic layer may include acrylate monomer, phenylacetylene, diamine, dianhydride, siloxane, silane, parylene, polyolefin such as polyethylene or polypropylene, polyethylene terephthalate (PET), fluoro-resin, polysiloxane, or the like.

In an exemplary embodiment, the thin film encapsulation layer 300 may be combined with the first region I of the transparent substrate 210. Furthermore, a thickness W1 of the thin film encapsulation layer 300 may be less than a distance L1 between a first opening 372 and a second opening 374 of the pixel-defining layer 370 that are adjacent to each other.

According to an exemplary embodiment, the mirror display device 18 may include the mirror module 208 and the display module 104 combined with the mirror module 208. Thus, a large-sized mirror display device may be effectively achieved. Furthermore, deterioration of display quality may be reduced and/or prevented.

In an exemplary embodiment, the thin film encapsulation layer 300 of the display module 104 is combined with the mirror module 208. Furthermore, a thickness of the thin film encapsulation layer 300 is less than a width of the pixel-defining layer 370. Thus, deterioration of display quality due to image separation may be reduced and/or prevented.

Figure 32:
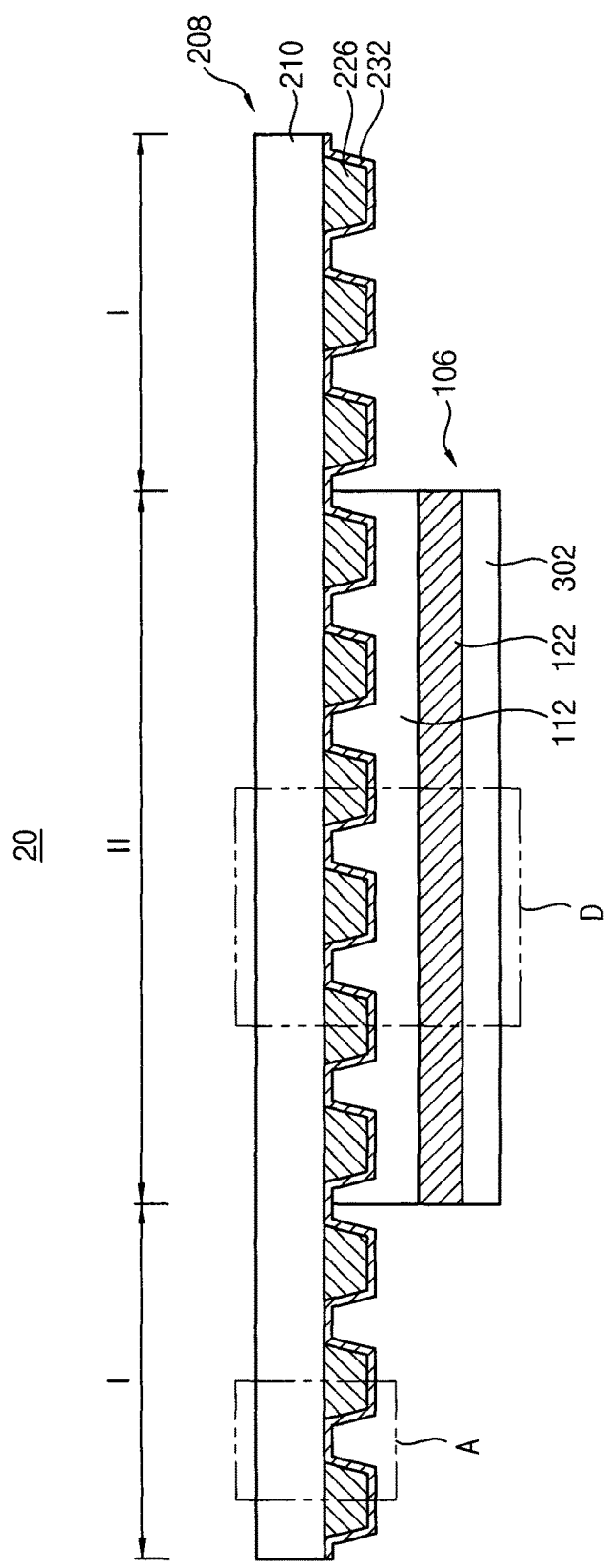
Figure 33:
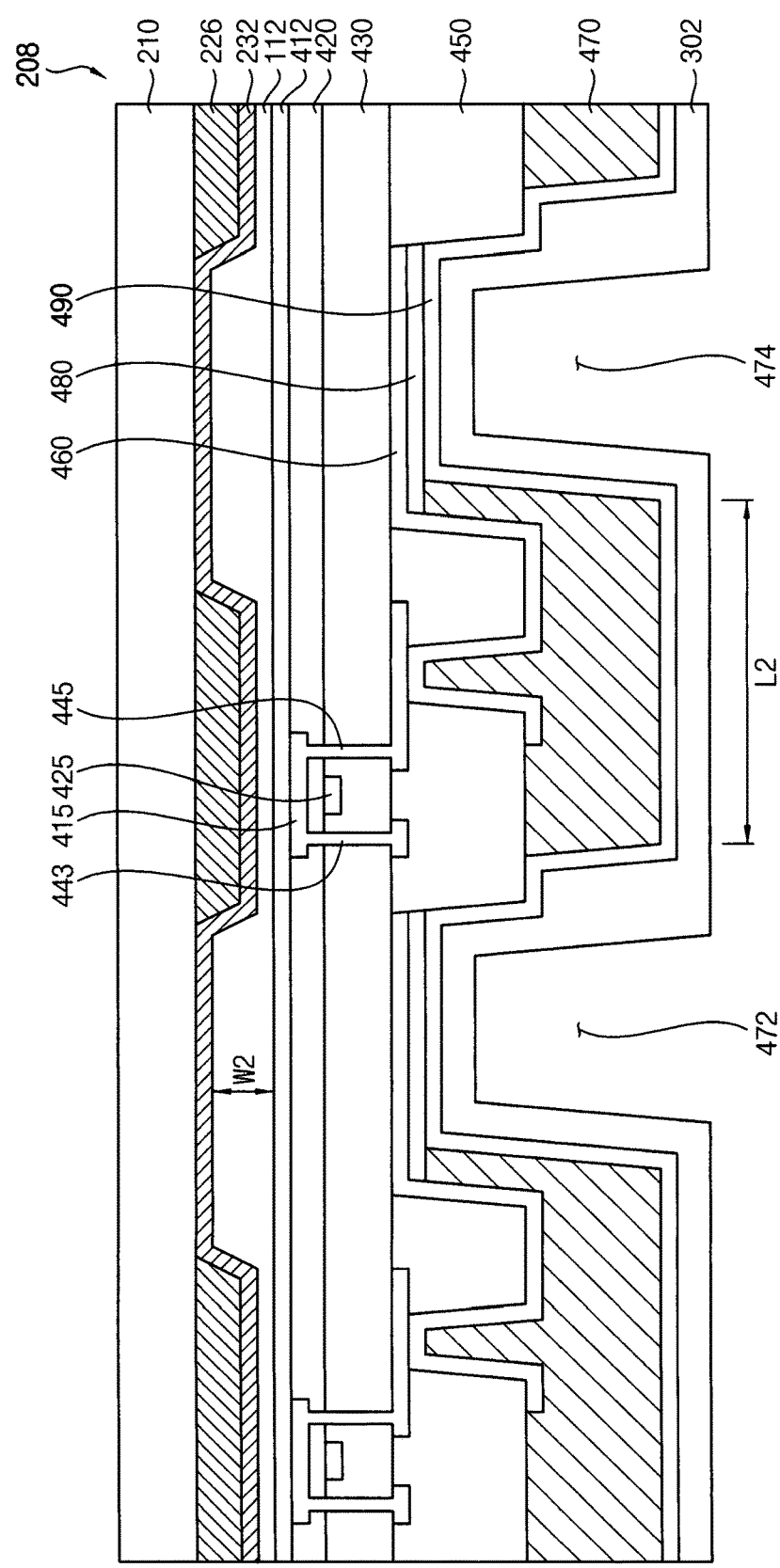

FIG. 32 is a cross-sectional view illustrating a mirror display device, according to an exemplary embodiment. FIG. 33 is an enlarged cross-sectional view illustrating the region 'D' of FIG. 32. The mirror display device may be substantially same as the mirror display device 18 illustrated in FIG. 30 except that a display module has a rear-emitting structure. Thus, same reference numerals may be used for same elements in the drawings, and any repeated explanation may be omitted.

Referring to FIGS. 32 and 33, a mirror display device 20 includes a display module 106 and a mirror module 208. The mirror module 208 includes a transparent substrate 210 including a second region II, a plurality of first mirror patterns 226 disposed in a first region I and the second region II of the transparent substrate 210, and a first mirror layer 232 continuously extending along the first mirror patterns 226. The second region II overlaps the display module 106.

The display module 106 includes a substrate 112, a display part 122 disposed on a lower surface of the substrate 112, and a thin film encapsulation layer 302 that covers the display part 122.

The display part 122 may include a plurality of switching elements and a plurality of display elements electrically connected to the switching elements. For example, each of the switching elements may include a thin film transistor including an active pattern 415, a gate insulation layer 420, a source electrode 443, and a drain electrode 445. For example, each of the display elements may include a first electrode 460, a display layer 480, and a second electrode 490.

The substrate 112 may include a glass substrate, a transparent plastic substrate, a flexible plastic substrate, or the like. In another exemplary embodiment, the substrate 112 may include an organic film.

A barrier layer 412 may be disposed under the substrate 112. The barrier layer 412 may prevent impurities from diffusing into the switching elements or the display elements.

The gate insulation layer 420 may be disposed under the barrier layer 412 to cover the active pattern 415. The gate electrode 425 may be disposed under the gate insulation layer 420, and may overlap the active pattern 415.

The insulation interlayer 430 may disposed under the gate insulation layer 420 to cover the gate electrode 425. The source electrode 443 and the drain electrode 445 may pass through the insulation interlayer 430 and the gate insulation layer 420 to contact the active pattern 415.

The via insulation layer 450 may cover the source electrode 443 and the drain electrode 445. The first electrode 460 may pass through the via insulation layer 450 to contact the drain electrode 445.

The pixel-defining layer 470 may be disposed under the via insulation layer 450. The pixel-defining layer 470 may cover an end portion of the first electrode 460. The pixel-defining layer 470 may include a plurality of openings 472 and 474 that expose the display layer 480. The display layer 480 may be disposed under the first electrode 460.

The second electrode 490 may be disposed on a surface of the pixel-defining layer 470 and a surface of the display layer 480 exposed through the openings 472 and 474 of the pixel-defining layer 470. The thin film encapsulation layer 302 may be disposed on a surface of the second electrode 490.

The barrier layer 412, the active pattern 415, the gate insulation layer 420, the gat electrode 425, the insulation interlayer 430, the source electrode 443, the drain electrode 445, the via insulation layer 450, the first electrode 460, the pixel-defining layer 470, the display layer 480, and the second electrode 490 may include a material substantially same as the barrier layer 310, the active pattern 315, the gate insulation layer 320, the gat electrode 325, the insulation interlayer 330, the source electrode 343, the drain electrode 345, the via insulation layer 350, the first electrode 360, the pixel-defining layer 370, the display layer 380 and the second electrode 390 that are illustrated in FIGS. 1 and 3.

In an exemplary embodiment, the substrate 112 may be combined with the first region I of the transparent substrate 210. Furthermore, a thickness W2 of the substrate 112 may be less than a distance L2 between a first opening 472 and a second opening 474 of the pixel-defining layer 470 that are adjacent to each other. For example, the substrate 112 may include an organic film.

According to an exemplary embodiment, the mirror display device 20 may include the mirror module 208 and the display module 106 combined with the mirror module 208. Thus, a large-sized mirror display device may be effectively achieved. Furthermore, deterioration of display quality may be reduced and/or prevented.

In an exemplary embodiment, the display module 106 having a rear-emitting structure is combined with the mirror module 208. Furthermore, a thickness of the substrate 112 is less than a width of the pixel-defining layer 470. Thus, deterioration of display quality due to image separation may be reduced and/or prevented.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present disclosure.

What is claimed is:

1. A mirror display device comprising: a mirror module comprising a transparent substrate and a plurality of first mirror patterns, wherein the transparent substrate has a first region and a second region adjacent to the first region, and the plurality of first mirror patterns are disposed on a surface of the transparent substrate in the first region; and a display module comprising a display part that emits a light and a plurality of second mirror patterns, wherein the display module is combined with the mirror module on the surface of the transparent substrate in the second region.

2. The mirror display device of claim 1, wherein the mirror module comprises a first mirror layer continuously extending along the plurality of first mirror patterns, and the display module further comprises a second mirror layer continuously extending along the plurality of second mirror patterns.

3. The mirror display device of claim 2, wherein the display part comprises a light-emitting area and a non-emitting area, and the light-emitting area overlaps an area between the plurality of second mirror patterns, and the non-emitting area overlaps a stacked area where the second mirror layer overlaps the plurality of second mirror patterns.

4. The mirror display device of claim 3, wherein the light-emitting area comprises an organic light-emitting layer or a liquid crystal layer.

5. The mirror display device of claim 2, wherein a distance between the plurality of first mirror patterns and the surface of the transparent substrate is substantially same as a distance between the plurality of second mirror patterns and the surface of the transparent substrate.

6. The mirror display device of claim 1, wherein the display module further comprises a base substrate on which the plurality of second mirror patterns are disposed, and the base substrate is disposed between the plurality of second mirror patterns and the transparent substrate.

7. The mirror display device of claim 1, wherein the display module further comprises a base substrate on which the plurality of second mirror patterns are disposed, and the plurality of second mirror patterns are disposed between the base substrate and the transparent substrate.

8. The mirror display device of claim 2, wherein the plurality of first and second mirror patterns and the first and second mirror layers include a metal.

9. The mirror display device of claim 2, wherein the plurality of first and second mirror patterns include a first material, and the first and second mirror layers include a second material that is different from the first material.

10. The mirror display device of claim 1, wherein the mirror module further comprises a phase compensation layer disposed between the plurality of first mirror patterns and the transparent substrate in the first region.

11. The mirror display device of claim 1, wherein the mirror module further comprises a recess, in which at least a portion of the display module is disposed, in the second region of the transparent substrate.

12. A mirror display device comprising:
    a mirror module comprising a transparent substrate and a plurality of first mirror patterns disposed on a surface of the transparent substrate in a first region of the transparent substrate; and
    a display module combined with the transparent substrate in a second region of the transparent substrate that is adjacent to the first region of the transparent substrate and comprising a display part that emits a light.

13. The mirror display device of claim 12, wherein the display part comprises:
    a plurality of switching elements disposed on a substrate;
    an insulation structure that covers the switching elements;
    a first electrode that passes through the insulation structure and is electrically connected to the switching elements;
    a display layer disposed on the first electrode; and
    a second electrode disposed on the display layer, and
    wherein the display module further comprises a thin film encapsulation layer disposed on a surface of the second electrode.

14. The mirror display device of claim 13, wherein the display module further comprises a pixel-defining layer disposed on the insulation structure and comprising an opening that exposes the first electrode.

15. The mirror display device of claim 14, wherein the thin film encapsulation layer is combined with the transparent substrate in the second region, and
    a thickness of the thin film encapsulation layer is less than a distance between a first opening and a second opening that is adjacent to the first opening, of the pixel-defining layer.

16. The mirror display device of claim 14, wherein the substrate is combined with the transparent substrate in the second region, and
    a thickness of the substrate is less than a distance between a first opening and a second opening that is adjacent to the first opening, of the pixel-defining layer.

17. A method of manufacturing a mirror display device, the method comprising: providing a display module comprising a substrate, a mirror substrate, and a display part disposed between the substrate and the mirror substrate; providing a mirror module comprising a transparent substrate, a plurality of first mirror patterns, and a first mirror layer continuously extending along the plurality of first mirror patterns, the transparent substrate including a first region and a second region adjacent to the first region, the plurality of first mirror patterns being disposed on a surface of the transparent substrate in the first region; and combining the display module with the mirror module such that the display module overlaps the transparent substrate in the second region.

18. The method of claim 17, wherein providing the display module comprises: forming a plurality of second mirror patterns on a base substrate; and forming a second mirror layer continuously extending along the plurality of second mirror patterns.

19. The method of claim 17, wherein the mirror module further comprises a phase compensation layer disposed between the plurality of first mirror patterns and the transparent substrate in the first region.

20. The method of claim 17, wherein the mirror module further comprises a recess, in which at least a portion of the display module is disposed, in the second region of the transparent substrate.

* * * * *